(12) United States Patent
Lesso et al.

(10) Patent No.: US 11,696,452 B2
(45) Date of Patent: Jul. 4, 2023

(54) MULTI-LEVEL MEMRISTOR ELEMENTS

(71) Applicant: Cirrus Logic International Semiconductor Ltd., Edinburgh (GB)

(72) Inventors: John Paul Lesso, Edinburgh (GB); Gordon James Bates, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/308,695

(22) Filed: May 5, 2021

(65) Prior Publication Data

US 2021/0257405 A1    Aug. 19, 2021

Related U.S. Application Data

(63) Continuation of application No. 16/781,157, filed on Feb. 4, 2020, now Pat. No. 11,018,186.

(60) Provisional application No. 62/801,895, filed on Feb. 6, 2019.

(30) Foreign Application Priority Data

May 30, 2019    (GB) ..................... 1907685

(51) Int. Cl.
| | |
|---|---|
| *G11C 11/00* | (2006.01) |
| *H10B 61/00* | (2023.01) |
| *G06N 3/02* | (2006.01) |
| *G11C 11/16* | (2006.01) |
| *H10N 50/10* | (2023.01) |

(52) U.S. Cl.
CPC ............. *H10B 61/10* (2023.02); *G06N 3/02* (2013.01); *G11C 11/165* (2013.01); *H10N 50/10* (2023.02)

(58) Field of Classification Search
CPC ............ G11C 13/0069; G11C 13/0004; G11C 13/0007; G11C 2213/79; G11C 2213/72
USPC .................................................. 365/158, 148
See application file for complete search history.

(56) References Cited

U.S. PATENT DOCUMENTS

| | | | |
|---|---|---|---|
| 3,979,735 A * | 9/1976 | Payne .................... | H03K 3/288 257/E23.168 |
| 6,252,795 B1 * | 6/2001 | Hansen .................. | G11C 11/14 365/158 |
| 10,079,059 B2 | 9/2018 | Buchanan | |
| 2018/0075904 A1 | 3/2018 | Ge et al. | |
| 2018/0300618 A1 | 10/2018 | Obradovic et al. | |

FOREIGN PATENT DOCUMENTS

| | | |
|---|---|---|
| CN | 107293642 A | 10/2017 |
| KR | 20170108627 A | 9/2017 |
| WO | 2015163927 A1 | 10/2015 |
| WO | 2018051931 A1 | 6/2019 |

OTHER PUBLICATIONS

Combined Search and Examination Report under Sections 17 and 18(3), UKIPO, Application No. GB1907685.0, dated Sep. 25, 2019.

* cited by examiner

*Primary Examiner* — Son T Dinh
(74) *Attorney, Agent, or Firm* — Jackson Walker L.L.P.

(57) ABSTRACT

There is described a two-terminal multi-level memristor element synthesised from binary memristors, which is configured to implement a variable resistance based on unary or binary code words. There is further described a circuit such as a synapse circuit implemented using a multi-level memristor element.

20 Claims, 14 Drawing Sheets

| Input Code | Linear R | Linear Conductance |
|---|---|---|
| 1 | 1 | 0 |
| 2 | 2 | 1 |
| 3 | 3 | 1 |
| 4 | 4 | 2 |
| 5 | 5 | 3 |
| 6 | 6 | 4 |
| 7 | 7 | 5 |
| 8 | 8 | 6 |
| 9 | 9 | 7 |
| 10 | 10 | 8 |
| 11 | 11 | 9 |
| 12 | 12 | 10 |
| 13 | 13 | 12 |
| 14 | 14 | 13 |
| 15 | 15 | 15 |
| 16 | 16 | 16 |

MULTI-LEVEL MEMRISTOR ELEMENTS

The present disclosure is a continuation of U.S. patent application Ser. No. 16/781,157, filed Feb. 4, 2020, which claims priority to U.S. Provisional Patent Application Ser. No. 62/801,895, filed Feb. 6, 2019, and United Kingdom Patent Application No. 1907685.0, filed May 30, 2019, each of which is incorporated by reference herein in its entirety.

BACKGROUND

Embodiments of the present disclosure relate to multi-level memristor elements and to methods and apparatus incorporating multi-level memristor elements, such as synapse circuits and neural networks using multi-level memristor elements.

Analog computing is where computing operations are performed using variations in the voltage and/or current levels of data signals. As such, analog computing provides an alternative to traditional digital computing systems, where such operations are performed using binary data. An advantage provided by analog computing systems is that such computing systems can be tailored for low power operation. This makes analog computing systems particularly suited for low-power, always-on applications, e.g. edge computing applications. The concept of "edge computing" moves at least some computational load associated with processing for some applications, which may conventionally have been performed by some central computing facilities, to the "edge devices", such as smartphones, tablet computers etc. that collect the relevant data to be processed. This can significantly reduce the computing burden on the central facilities.

For relatively time-critical systems, e.g. speech processing, the traditional Von Neumann computing architecture presents a bottleneck for carrying out any computing operations, where a processor module must access a separate memory module to retrieve data, and subsequently writes the output of any processing operations back to the memory for future use. The continual reading and writing of data between the processor and the memory consumes processing cycles and/or power, thereby limiting the overall efficiency of analog computing systems intended for low-power, fast-response operations.

In an attempt to address such a bottleneck, memristors have been suggested as an option for implementing in-processor memory. A memristor can be described as a resistor with memory, where the resistance of a memristor can be programmed based on voltage and/or current applied to the memristor.

As a result, an analog computing operation can be performed based on variations in current flow through the memristor, by adjusting the impedance of the memristor.

Memristors may be provided as binary memristors or multi-level or analog memristors. A symbol for a binary memristor is indicated at 10 in FIG. 1. Binary memristors are so-called as they are switchable between two different impedance states—which may be identified as a high impedance (or resistance) state (HI) or a low impedance (or resistance) state (LO). Analog memristors allow for more continuous variations in the impedance of the memristor element. However, such analog memristors present considerable manufacturing challenges, and difficulties in ensuring consistent operation between devices.

In addition, the general use of memristor-based elements in low-power, always-on applications, for instance in edge computing applications, presents continual challenges in the balancing of power consumption, accuracy, and processing speed. One such application area is for synapse circuits of machine learning systems, where a weighting value is to be applied to a data input to provide a weighted data output for use in multiply and accumulate operations.

Accordingly, there is a need for a memristor element and also a synapse cell that at least mitigate the above problems.

SUMMARY

Accordingly, there is provided a two-terminal multi-level memristor element synthesised from binary memristors, the multi-level memristor element comprising:

a plurality of binary memristor portions connected between first and second terminals of the multi-level memristor element, the binary memristor portions individually programmable between HI and LO resistance states, wherein the series-connected binary memristor portions can be programmed to provide a variable multi-level resistance between the first and second terminals.

In some embodiments the plurality of binary memristor portions are arranged in series between the first and second terminals of the multi-level memristor element.

Providing a multi-level memristor composed of binary memristors allows for a multi-level device to be synthesised from existing components which can be relatively easily and consistently manufactured.

Preferably, the binary memristors of the multi-level memristor element are from a common process.

That is, the binary memristors used in the multi-level memristor element are matched or scaled, so they have approximately the same dimensions, and/or approximately the same electrical characteristics. The use of matched memristors from a common process allows for the electrical characteristics of the memristors to be of a relatively uniform standard throughout the multi-level memristor element.

Preferably, the multi-level memristor element further comprises switching circuitry, the switching circuitry arranged to apply voltages or currents to individual binary memristor portions of the multi-level memristor element to control the programming of the respective binary memristor portions between HI and LO resistance states.

The switching circuitry may comprise any suitable switching mechanism, e.g. transistor-based switches.

Preferably, the multi-level memristor element further comprises a program control module coupled with the switching circuitry, the program control module arranged to receive input data or weighting data to be applied using the memristor element, and wherein the program control module controls the switching circuitry to program the binary memristor portions of the memristor element based on the received input data or weighting data.

Preferably, the program control module is arranged to control the programming of the binary memristor portions of the memristor element based on the received input data or weighting data to provide for a linear variation of conductance of the memristor element based on the received input data or weighting data.

Preferably, the multi-level memristor element is configured to implement unary coding or binary coding, wherein a unary code word or a binary code word is used to define the resistance level of the multi-level memristor element.

Preferably, the number of binary memristor portions arranged in series corresponds to the length of the unary or binary code word. Accordingly, each of the binary memristor portions of the multi-level memristor element are configured to implement a bit of the unary code word or the binary code word.

In some embodiments, the multi-level memristor element further comprises at least one offset resistor r0 arranged in series with the plurality of binary memristor portions.

The offset resistor r0 selected to limit the absolute value of current allowed to pass through the multi-level memristor element, and thereby linearize the operation of the multi-level memristor element. It will be understood that the offset resistor r0 may be positioned among the series-connected binary memristor portions. That is, the provision of the offset resistor r0 in series with the binary memristor portions is not limiting to the actual location of the offset resistor within the memristor element.

Preferably, the resistance of the at least one offset resistor r0 is selected such that r0 is greater than the maximum total resistance contribution of the combined binary memristor portions of the element. Preferably, the value of r0 is selected to be greater than the combined resistance of the binary memristor portions of the memristor element, when the binary memristor portions are set to the HI resistance state.

In some embodiments, $r0 \gg R(LO)$, where R(LO) (also referred to as R(low)) is the resistance of the LO resistance state of the binary memristors of the multi-level memristor element. In other embodiments, $r0 \gg R(HI)$, where R(HI) (also referred to as R(high)) is the resistance of the HI resistance state of the binary memristors of the multi-level memristor element.

Unary Coding Approach

For a unary coding implementation, the binary memristor portions each comprise a binary memristor.

Preferably, the multi-level memristor element is configured to perform dynamic element matching of the binary memristor portions.

Dynamic element matching means that for a particular unary code word, the assignment of the bits of the code word among the binary memristor portions of the multi-level memristor element is rotated or varied for a number of cycles of that particular code word.

By rotating or varying the bit assignments of the code word among the binary memristor portions, accordingly any mismatches of electrical characteristics between binary memristor portions is compensated for or rotated out of the resultant output signal.

Preferably, the multi-level memristor portion comprises a dynamic element matching (DEM) module coupled with switching circuitry of the multi-level memristor portion, the DEM module arranged to receive a unary code word to define the resistance level of the multi-level memristor element, and wherein the DEM module controls the programming of the binary memristor portions of the multi-level memristor element to vary the bit assignments of the unary code word among the binary memristors of the multi-level memristor element. The DEM module is arranged to vary the bit assignments during use of the memristor element.

Binary Coding Approach

For the binary coding implementation, preferably, the binary memristor portions are configured such that the difference in impedance between the HI and LO resistance states (delta R) of a first binary memristor portion is scaled relative to the (delta R) of the other binary memristor portions of the multi-level memristor element.

Preferably, the binary memristor portions are configured such that the variation in (delta R) across binary memristor portions of the multi-level memristor element follows a binary scale.

For a binary scale, it will be understood that the (delta R) of a first binary memristor portion is different from the (delta R) of the other binary memristor portions, wherein the (delta R) of binary memristor portions corresponding to adjacent bits of a binary code word differ by a factor of two.

Alternatively, the binary memristor portions are configured such that the variation in (delta R) across binary memristor portions of the multi-level memristor element is non-linearly scaled.

It will be understood that the selection of binary memristor portions may be configured to provide different scaling of the resistance levels of the memristor element, to provide a non-linear quantization of the weighting to be applied to a data signal. For example, the variation in (delta R) across binary memristor portions of the multi-level memristor element may be logarithmically scaled, may be scaled according to the mu-law algorithm, or may be scaled according to the A-law algorithm.

Preferably, for the binary coding implementation, a first binary memristor portion of the multi-level memristor element comprises a single binary memristor.

In one embodiment, at least one of the series-connected binary memristor portions comprises a binary memristor and a parallel shunt resistor, wherein the resistance of the parallel shunt resistor is selected to provide for a (delta R) of the binary memristor portion which is scaled relative to the other binary memristor portions of the multi-level memristor element.

Additionally or alternatively, at least some of the series-connected binary memristor portions may each comprise first and second resistance components, wherein the first resistance component is connected in series with the other binary memristor portions and the second resistance component is connected in parallel with the first resistance component, wherein one of the first and second resistance components is a binary memristor and the other of the first and second resistance components is a shunt resistor. For at least one of the binary memristor portions the second resistance component may be connected in parallel with the series connection of first resistance components from a plurality of binary memristor portions.

Additionally or alternatively, at least one of the series-connected binary memristor portions comprises a bank of binary memristors connected in parallel, the bank of binary memristors of a particular memristor portion being simultaneously switchable between HI and LO resistance states, wherein the number of parallel-connected binary memristors within the binary memristor portion is selected to provide for a (delta R) of the binary memristor portion which is scaled relative to the other binary memristor portions of the multi-level memristor element.

It will be understood that the multi-level memristor element may comprise a combination of different configurations of binary memristor portions, for example a first subset of the binary memristor portions may comprise a bank of binary memristors connected in parallel, the bank of binary memristors of a particular memristor portion being simultaneously switchable between HI and LO resistance states, and a second subset of the binary memristor portions may comprise a binary memristor and a parallel shunt resistor.

The combined use of such different configurations of binary memristor portion allows for the multi-level memristor element to be balanced for area and efficiency of operation.

It will be understood that the layout of binary memristor portions of a multi-level memristor element may be configured in any suitable manner and is not necessarily limited to a layout corresponding to a particular bit-order or endianness.

In one aspect there is provided a two-terminal multi-level memristor element synthesised from binary memristors, the multi-level memristor element comprising:
 a plurality of binary memristor portions arranged in series between first and second terminals of the multi-level memristor element, the binary memristor portions individually programmable between HI and LO resistance states,
wherein the series-connected binary memristor portions can be programmed to provide a variable multi-level resistance between the first and second terminals.

In one aspect there is provided a two-terminal multi-level resistance element synthesised from binary programmable-resistance memory components, the multi-level resistance element comprising: a plurality of binary programmable-resistance memory portions connected between first and second terminals of the multi-level resistance element, the binary programmable-resistance memory portions individually programmable between HI and LO resistance states, wherein the connected binary memristor portions can be programmed to provide a variable multi-level resistance between the first and second terminals.

In one aspect there is provided a programmable resistance element, the programmable resistance element comprising a plurality of programmable-resistance memory components arranged in combination between first and second terminals of the programmable resistance element to define a plurality of programmable portions, wherein each programmable portion comprises one or more of said programmable-resistance memory components configured such that each programmable portion can be individually programmed to a selected one of two different resistance states, and wherein said plurality of programmable portions can be programmed in combination to provide a selected one of more than two values of overall resistance between the first and second terminals.

Synapse Circuit

There is further provided a synapse circuit for a neural network system comprising a two-terminal multi-level memristor element.

Preferably, the synapse circuit comprises a multi-level memristor element synthesised from binary memristors, as in any of the above-described embodiments. Alternatively, the synapse circuit comprises an analog memristor element, as in a continuously-variable memristor component. It will be understood that the synapse circuit may comprise memory elements in the form of MRAM (magnetic RAM), such as STTRAM (Spin-Transfer Torque RAM), and/or ReRAM (Resistive RAM), such as Transition Metal Oxide-based RAM.

Preferably, the synapse circuit comprises:
 an input to receive at least one data input signal indicative of a data input, the data input signal provided as a voltage or current;
 an output to provide at least one data output current indicative of the data input times a defined weighting value; and
 at least first and second data paths between the input and the output, the data paths comprising a two-terminal multi-level memristor element,
wherein the at least one data input signal is applied to at least one of the data paths,
wherein the resistance level of at least one multi-level memristor element is adjusted based on the defined weighting value, and
wherein the data output current is based on the current through said at least first and second data paths.

Preferably, the synapse circuit further comprises:
 a weighting input to receive at least one weighting value indicative of a weighting to be applied to the data input, wherein the resistance level of at least one multi-level memristor element is adjusted based on the received weighting value.

Preferably, the synapse circuit comprises at least one offset resistor R0 provided in each of the at least first and second data paths, the at least one offset resistor R0 arranged in series with the multi-level memristor element.

The offset resistor R0 is selected to limit the absolute value of current allowed to pass through the multi-level memristor element, and thereby to linearize the operation of the synapse circuit. Preferably, the resistance of the at least one offset resistor R0 is selected such that R0 is selected to be greater than the resistance of the multi-level memristor element, when the multi-level memristor element is set to the HI resistance state.

In one embodiment, the resistance of the at least one offset resistor R0 is selected such that $R0 \gg R(LO)$, where $R(LO)$ is the resistance of the LO resistance state of the binary memristors of the multi-level memristor element. In other embodiments, $R0 \gg R(HI)$, where $R(HI)$ is the resistance of the HI resistance state of the binary memristors of the multi-level memristor element.

It will be understood that the offset resistor R0 may be used in addition to, or as an alternative to, an offset resistor r0 provided as part of the multi-level memristor element.

In one aspect, the synapse circuit is arranged such that:
 the first data path is configured as a weighting path, wherein the resistance level of the multi-level memristor element of the first data path is adjusted based on the at least one weighting value, to provide a weight-dependent data current flowing through the weighting path, and
 the second data path is configured as a reference path, wherein the resistance level of the multi-level memristor element of the second data path is set at a defined level, to provide a weight-independent reference current flowing through the reference path,
wherein the data output current is based on the difference between the weight-dependent data current and the weight-independent reference current.

As memristors may have a data-dependent offset current, providing a reference path allows for the offset current to be compensated for in the resulting output current, by subtracting the weight-dependent data current from the weight-independent reference current or vice versa. As a result, the data output to be derived from the output data current is effectively based on the difference in resistance between the two paths.

The defined resistance level of the multi-level memristor element of the second data path may be selected based on the characteristics of the synapse circuit or the associated application of the synapse circuit, the characteristics of the at least one data input voltage, and/or the desired characteristics of the data output current.

In one aspect, the defined resistance level of the multi-level memristor element of the second data path may be such that the multi-level memristor element is in a LO resistance state. In an alternative aspect, the defined resistance level of the multi-level memristor element of the second data path may be such that the multi-level memristor element is in a HI resistance state. In a further aspect, the defined resistance level of the multi-level memristor element of the second data path may be such that the multi-level memristor element is in a specified resistance state between the HI and LO resistance states, e.g. mid-way between the HI and LO resistance states.

In an alternative aspect, the synapse circuit is arranged such that:

the first data path is configured as a positive weighting path, wherein the resistance level of the multi-level memristor element of the first data path is adjusted based on a positive component of the at least one weighting value, to provide a positively-weighted data current flowing through the positive weighting path, and the second data path is configured as a negative weighting path, wherein the resistance level of the multi-level memristor element of the second data path is adjusted based on a negative component of the at least one weighting value, to provide a negatively-weighted data current flowing through the negative weighting path, and wherein the data output current is based on the difference between the positively- and negatively-weighted data currents.

In a further alternative aspect, the synapse circuit is arranged such that:

an input is arranged to receive a differential data input signal indicative of a data input, the data input signal being differentially coded as a non-inverse signal and an inverse signal;

the first data path is configured as a weighting path to apply a weighting to the non-inverse signal, wherein the resistance level of the multi-level memristor element of the first data path is adjusted based on the at least one weighting value, to provide a first weighted current, and the second data path is configured as a weighting path to apply a weighting to the inverse signal, wherein the resistance level of the multi-level memristor element of the second data path is adjusted based the at least one weighting value, to provide a second weighted current, and wherein the data output current is based on the difference between the first and second weighted currents.

Preferably, the multi-level memristor elements of the first and second data paths are configured such that the weights of the first and second paths are the same.

The synapse circuit is configured wherein at least a portion of the data input voltage is applied across both the first and second data paths, and wherein the resistance level of the multi-level memristor element of the respective first and second data paths is adjusted based on that portion of the data input voltage applied across the respective data paths.

For example, the data input voltage may comprise separate positive and negative portions which are applied across respective first and second data paths, wherein the resistance level of the multi-level memristor element is selected based on the positive and negative portions of the at least one weighting value.

The synapse circuit may be configured to implement a differential data system. The use of such a differential data system may compensate for any data-dependent offset current present in the synapse circuit, thereby removing the need for a separate reference path.

There is further provided a neural network comprising a synapse circuit as in any of the above-described embodiments.

Preferably, there is provided a neuron circuit comprising:
  at least one synapse circuit as in any of the above-described embodiments, and
  a non-linearity module to apply a non-linearity to the output of the at least one synapse circuit.

Preferably, the neuron circuit comprises a plurality of synapse circuits, and wherein the non-linearity module applies a non-linearity to the sum or difference of the outputs of the synapse circuits.

DETAILED DESCRIPTION

Embodiments of the present disclosure will now be described, by way of example only, with reference to the accompanying drawings, in which.

Figure 4A:
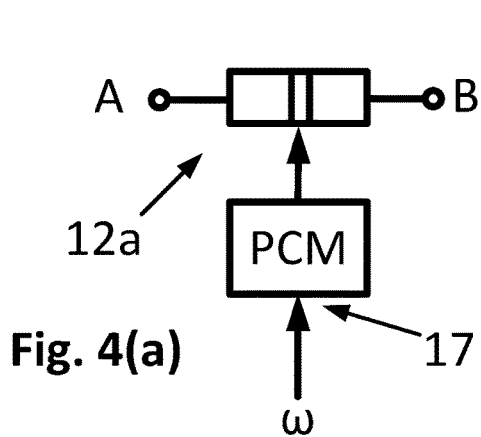
Figure 5:
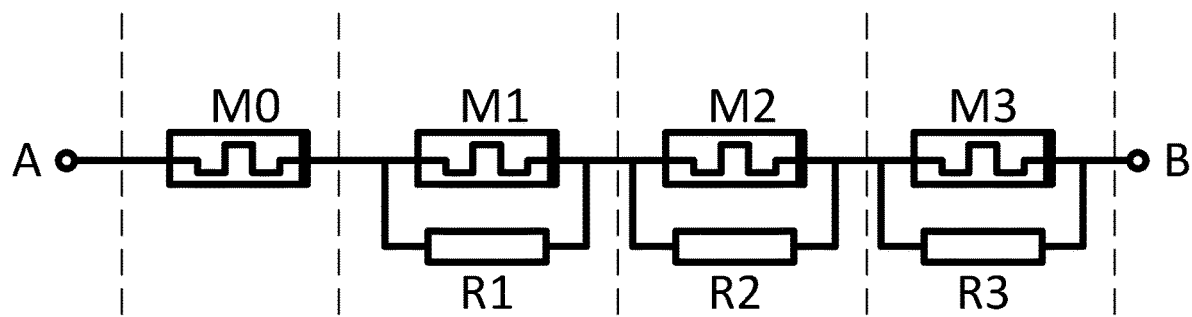
Figure 6:
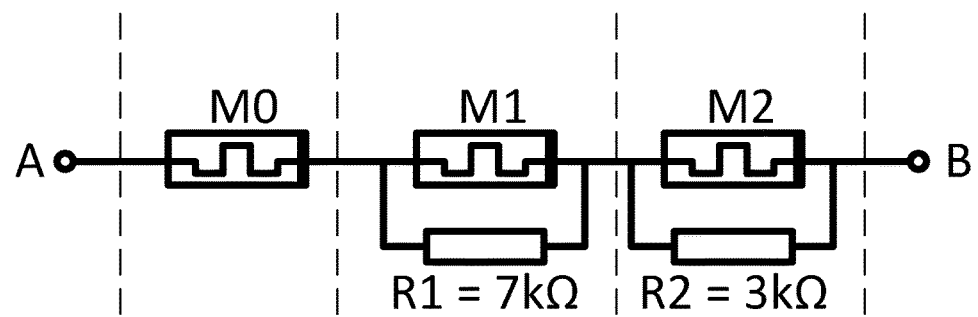
Figure 7:
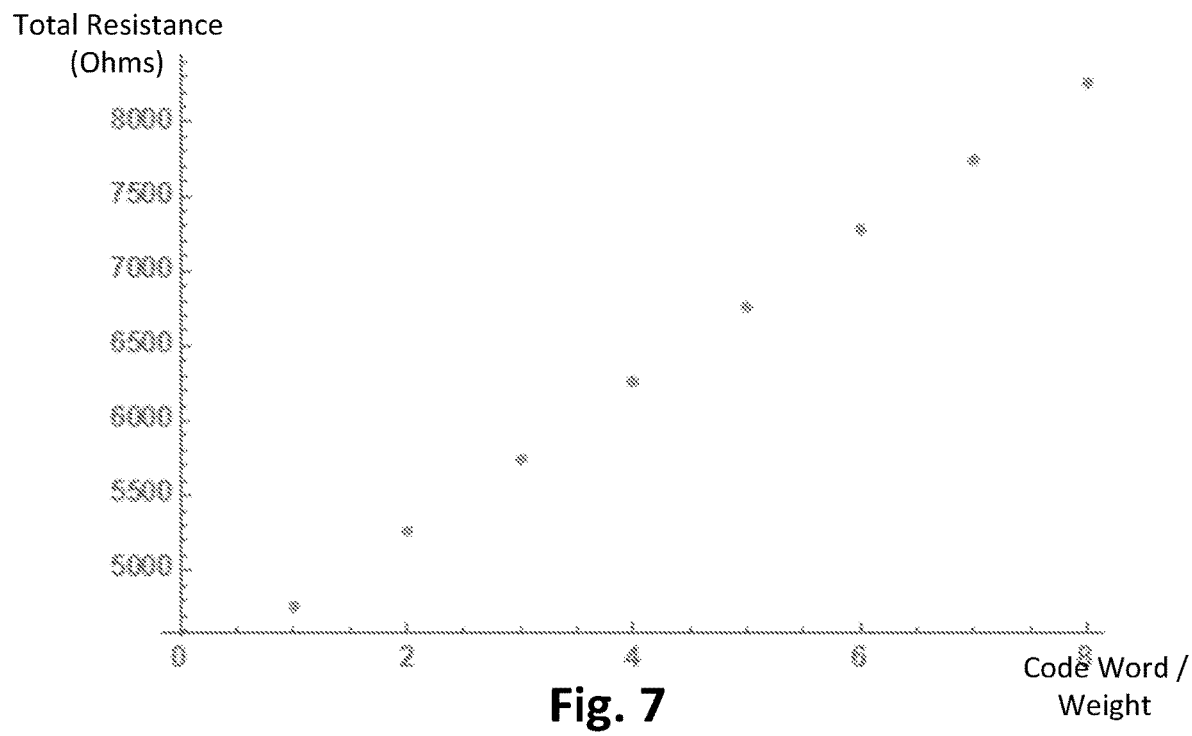
Figure 8:
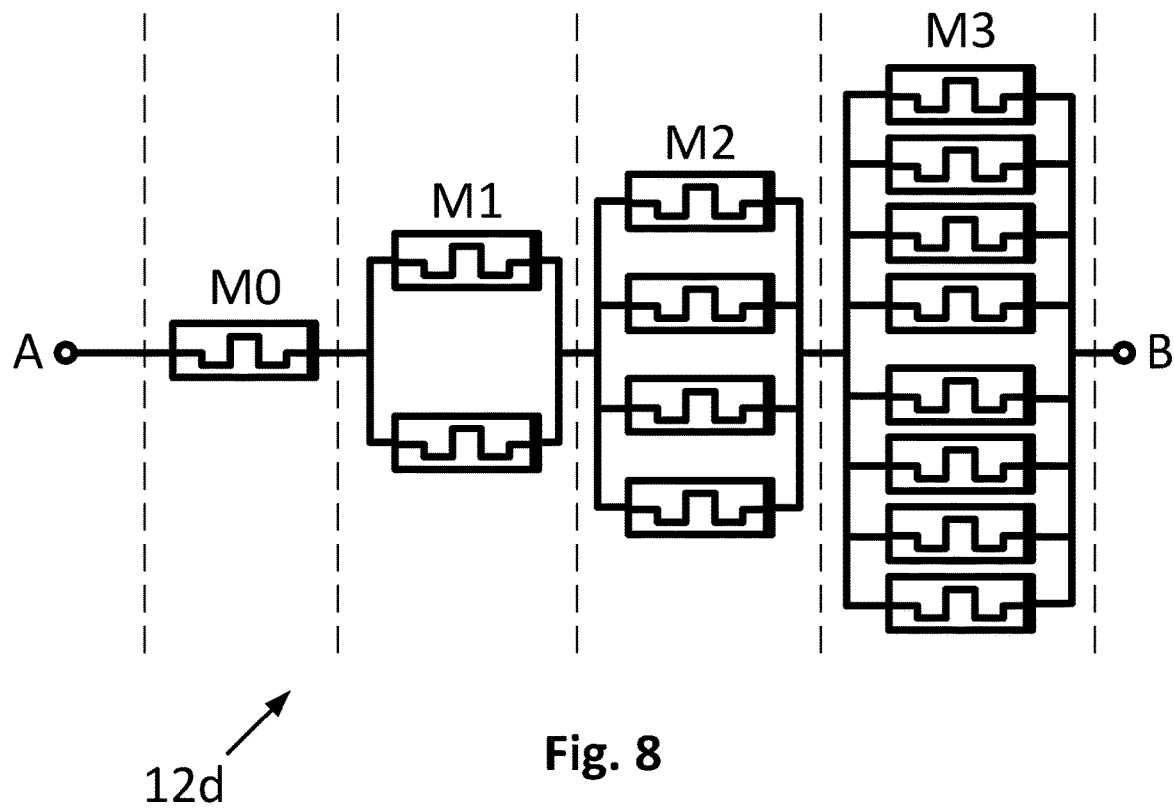
Figure 9:
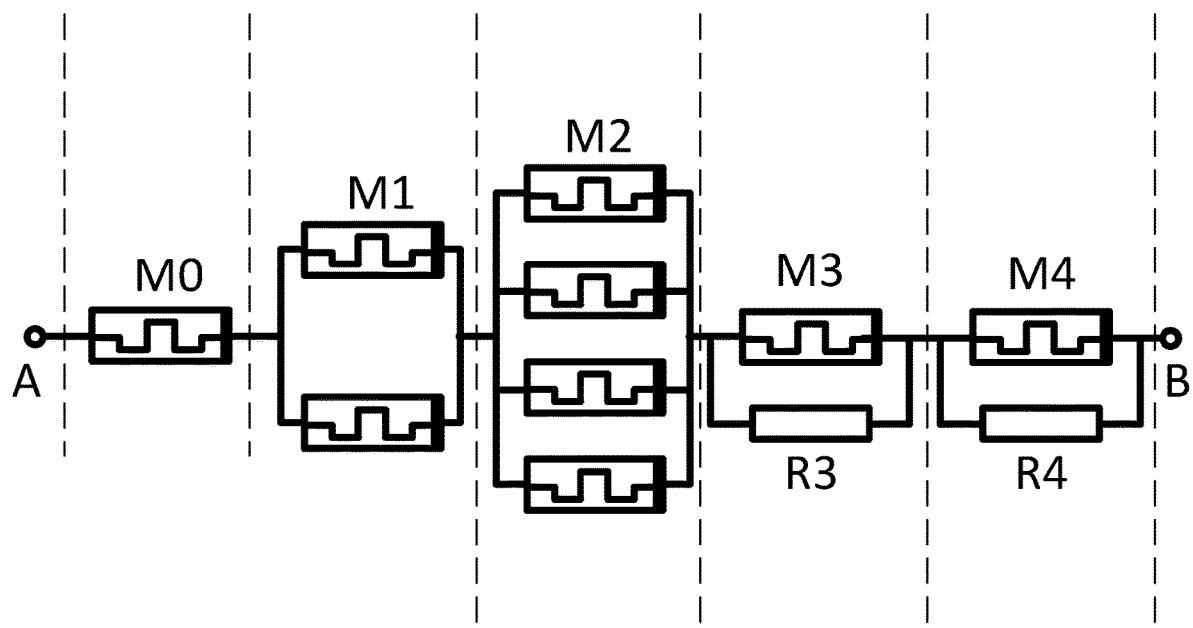
Figure 10A:
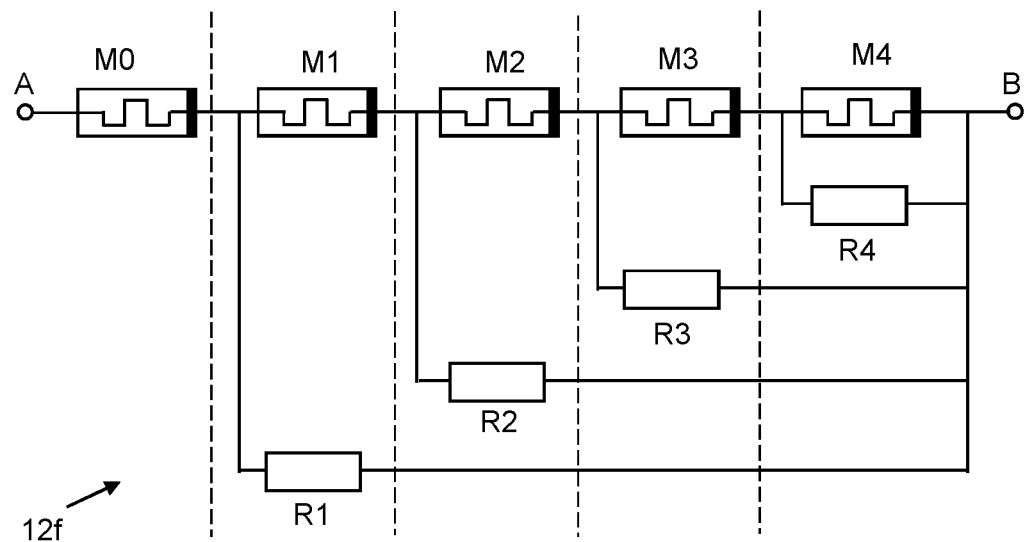
Figure 10B:
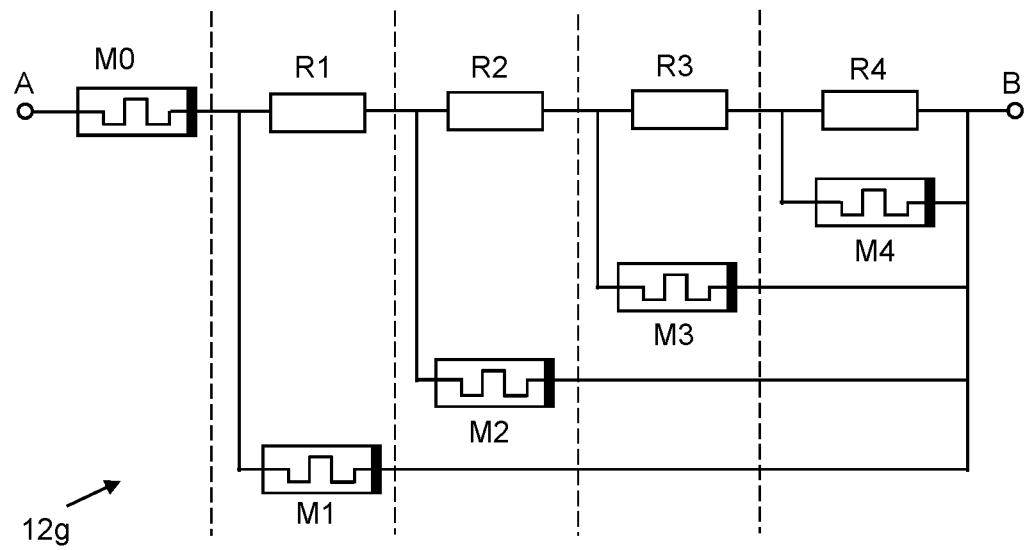
Figure 11:
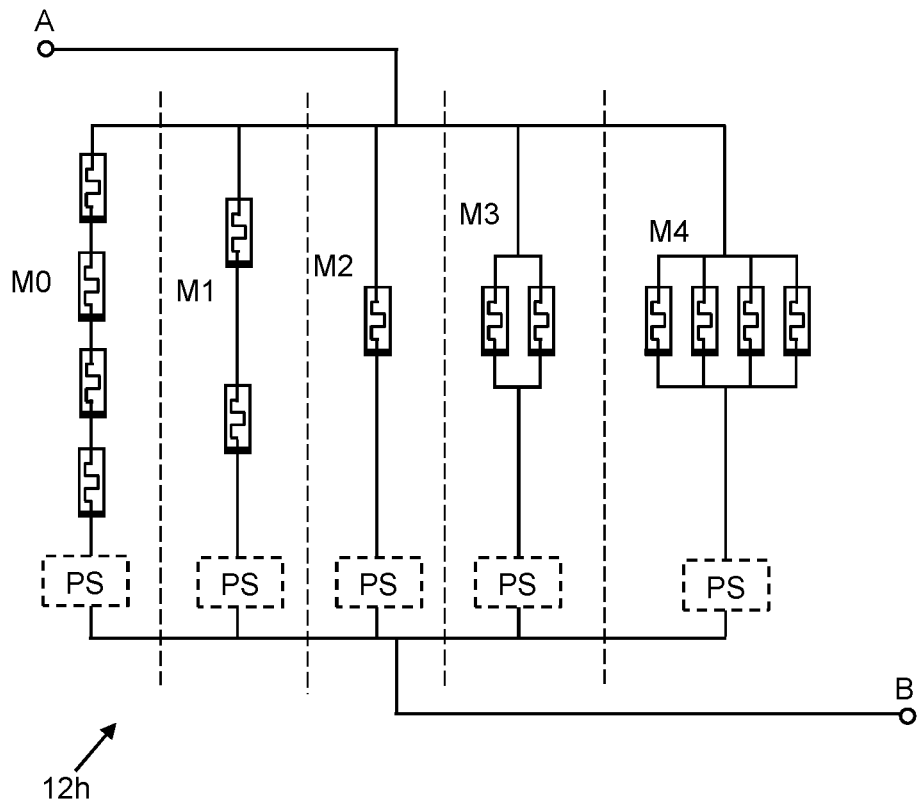
Figure 12:
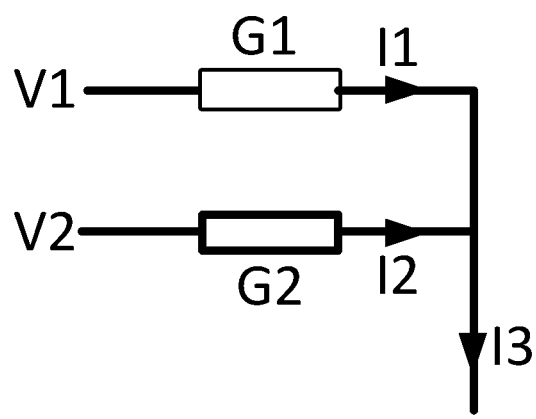
Figure 13:
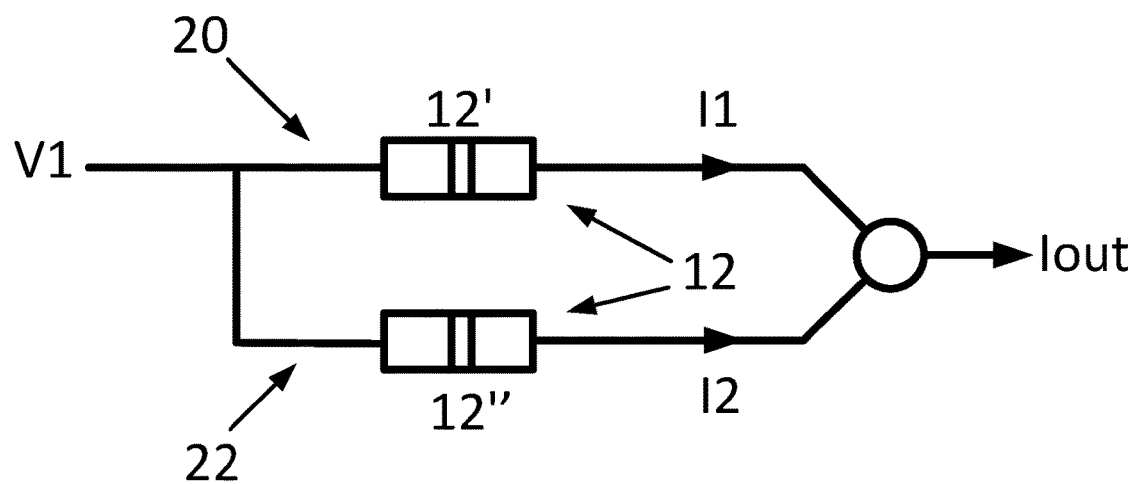
Figure 14:
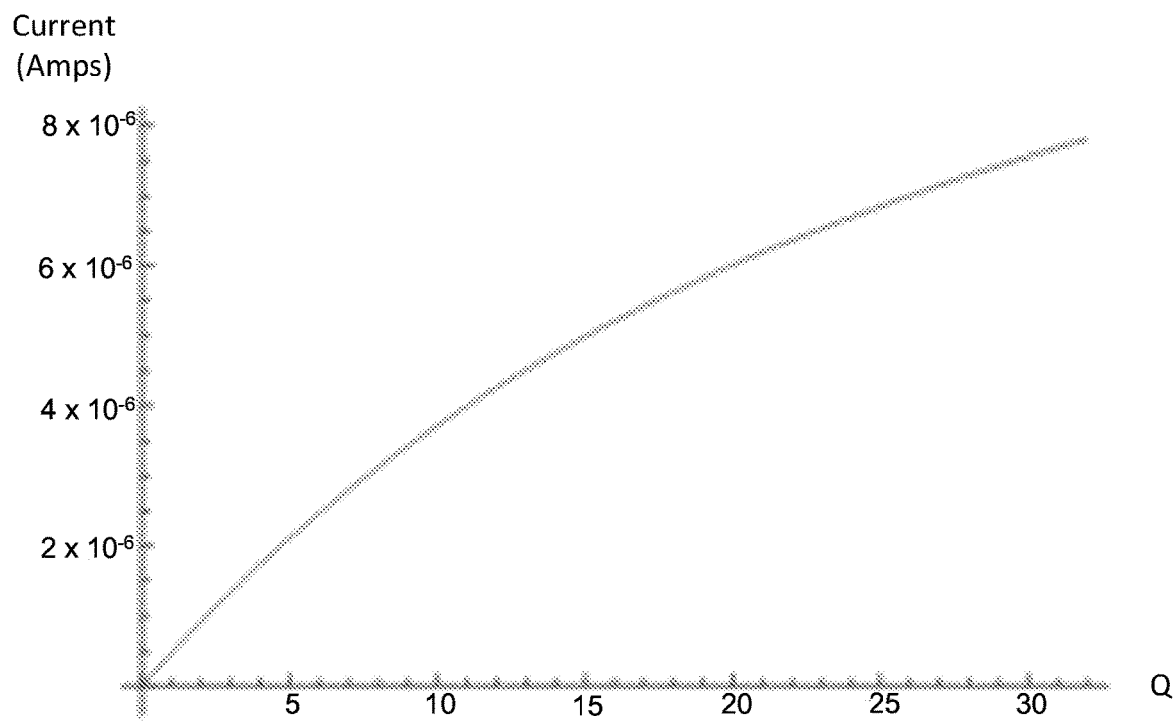
Figure 15:
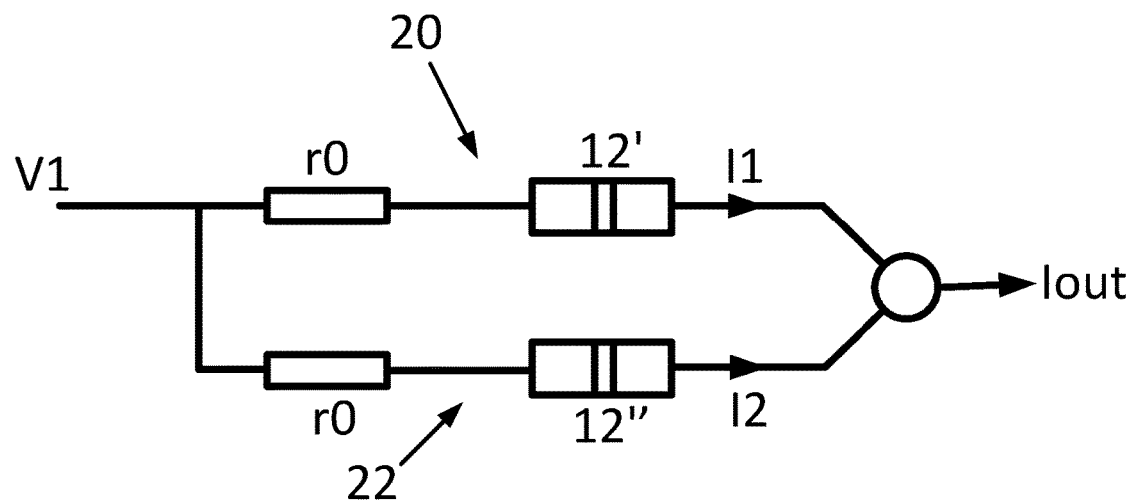
Figure 16:
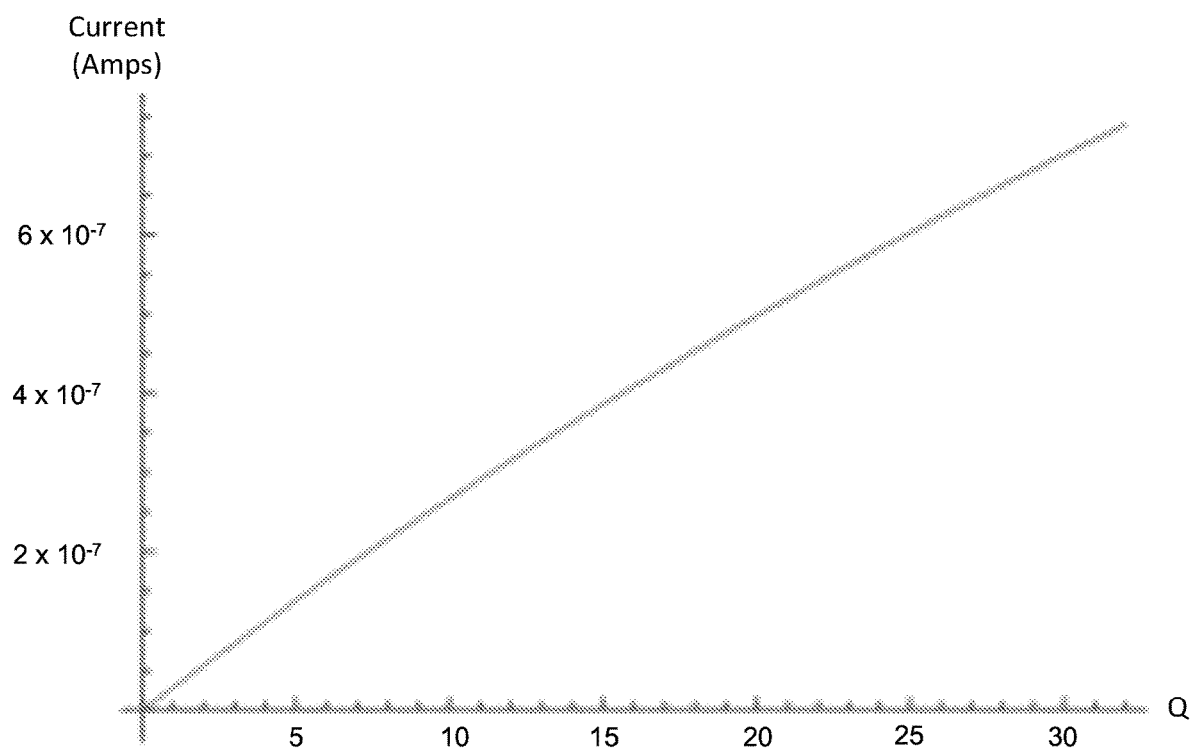
Figure 17:
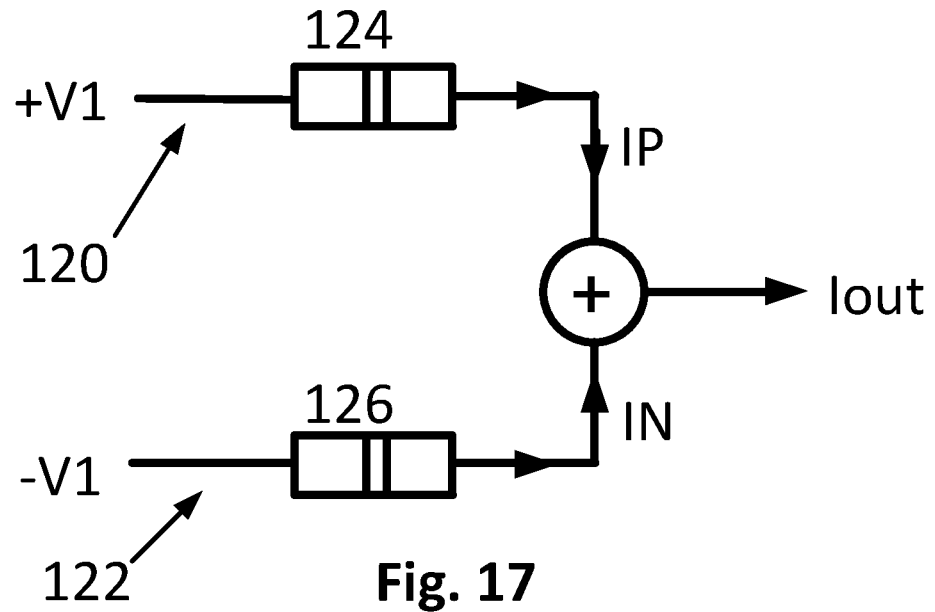
Figure 18:
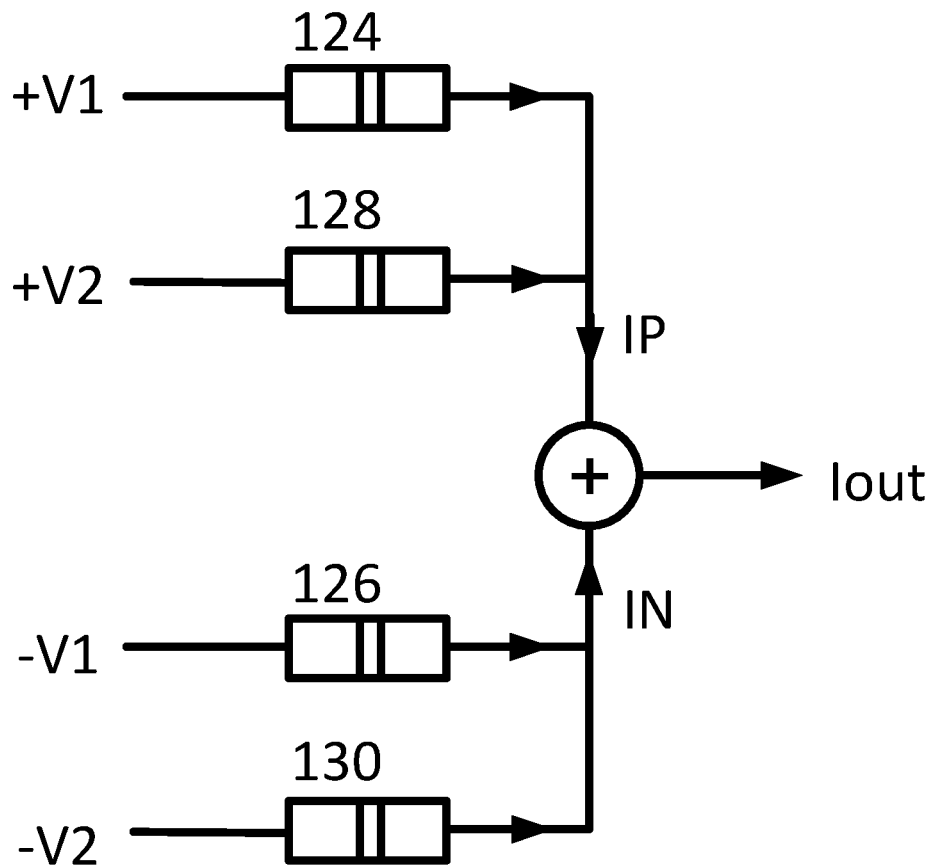
Figure 19:
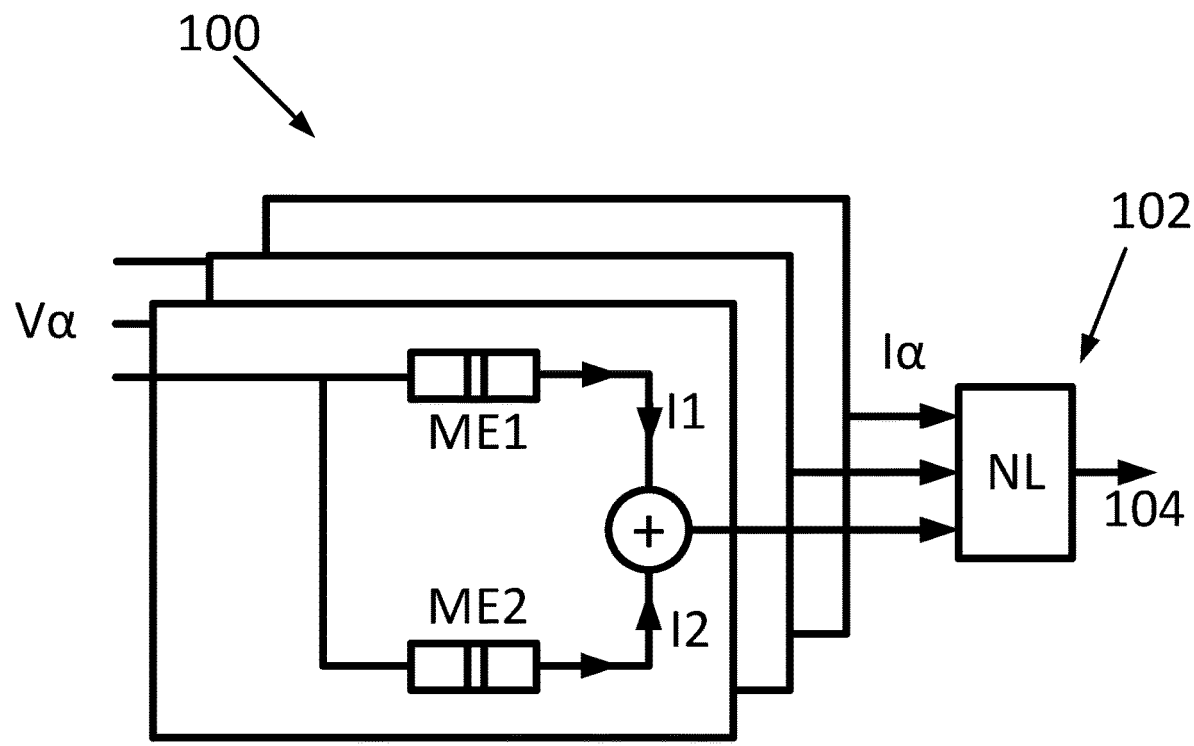
Figure 20:
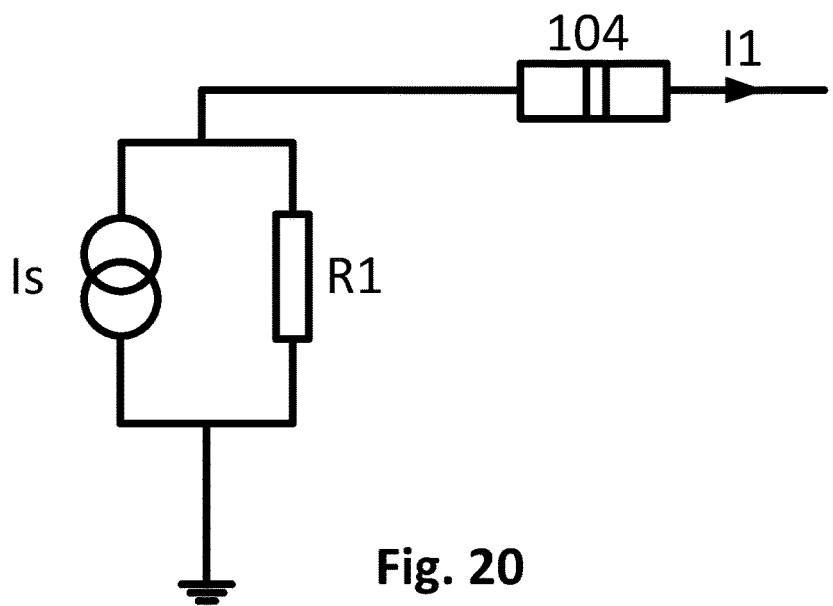
Figure 21:
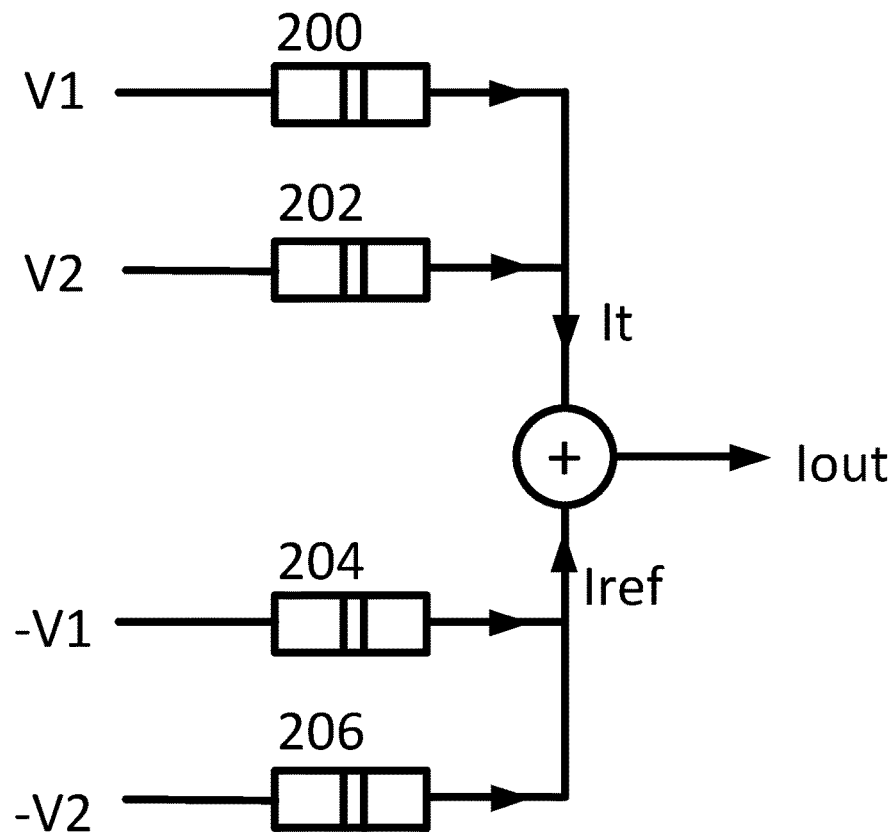
Figure 22:
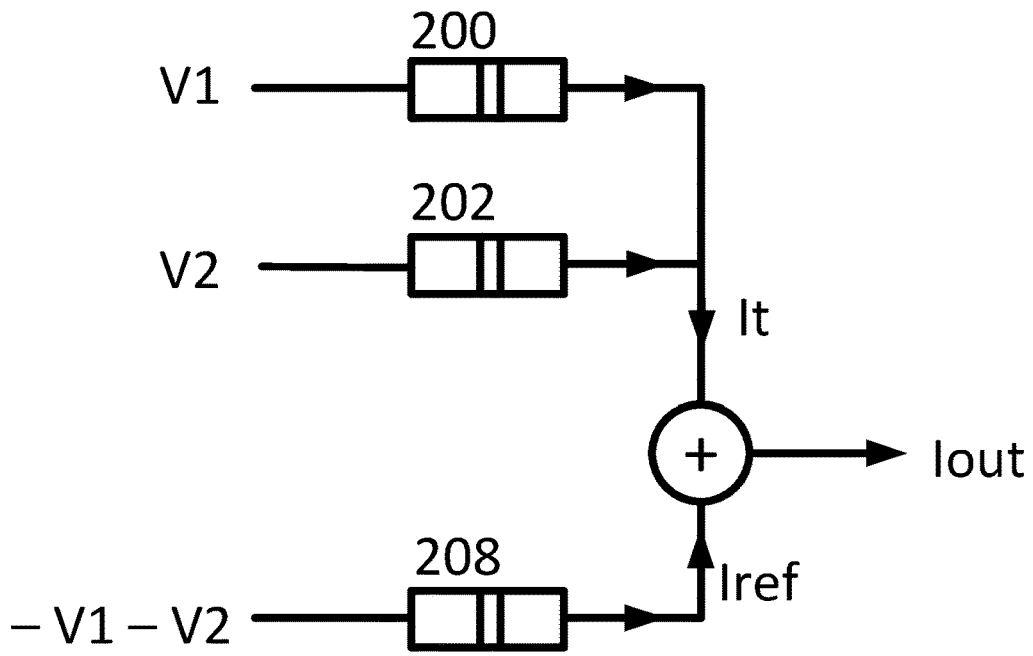
Figure 23:
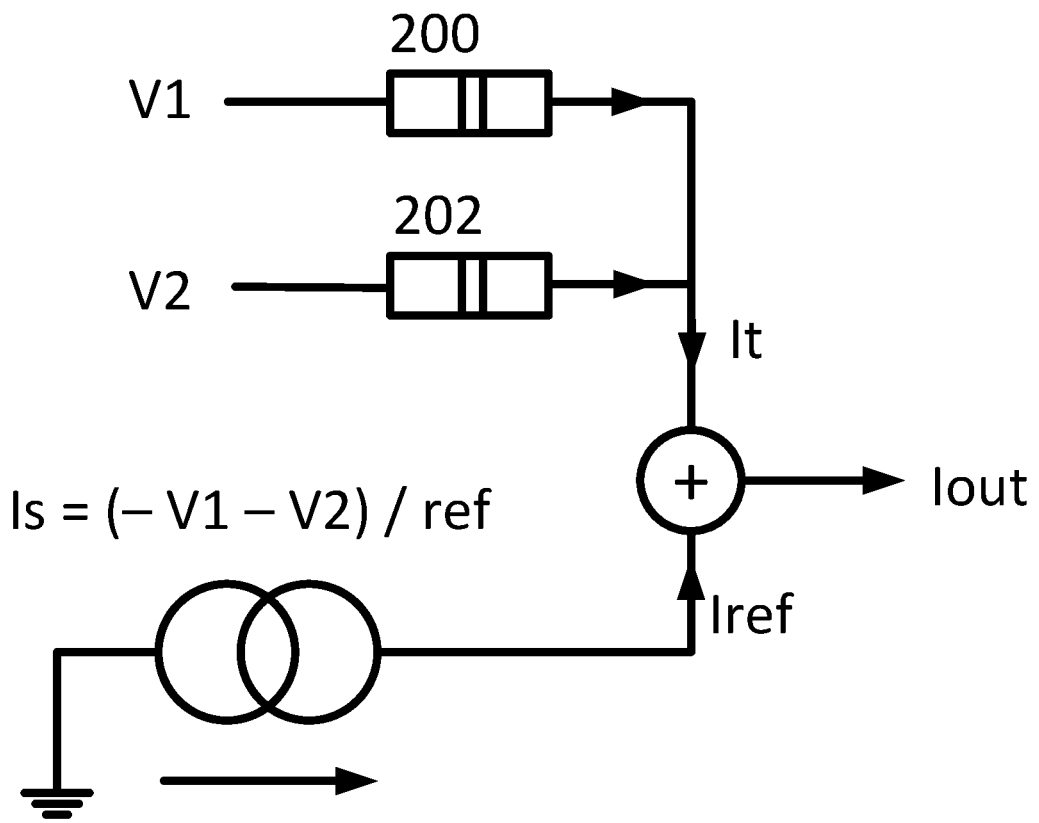
Figure 24:
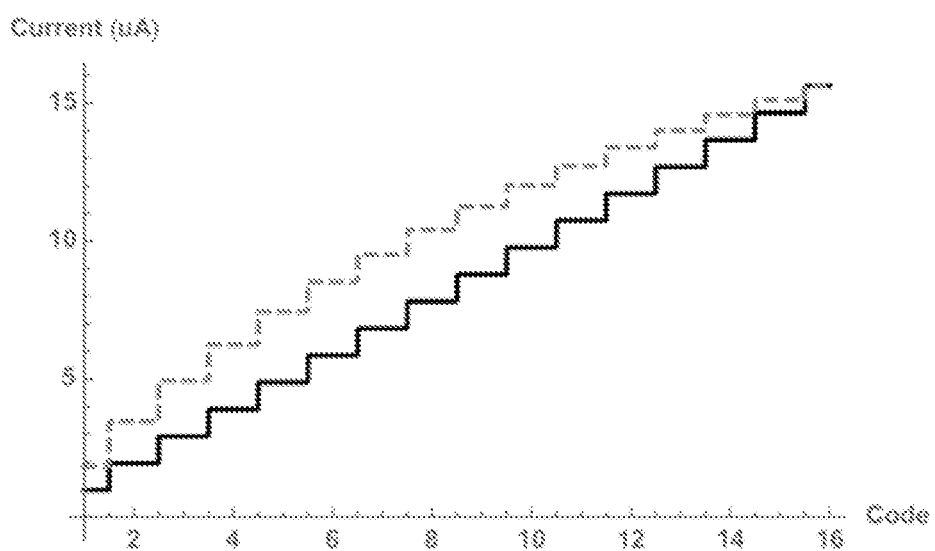
Figures 25, 26:
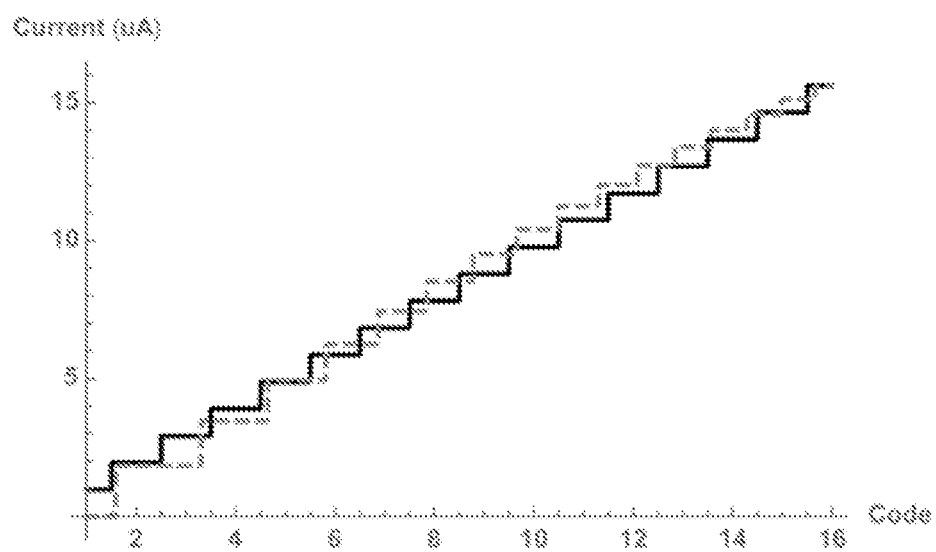
Figure 27:
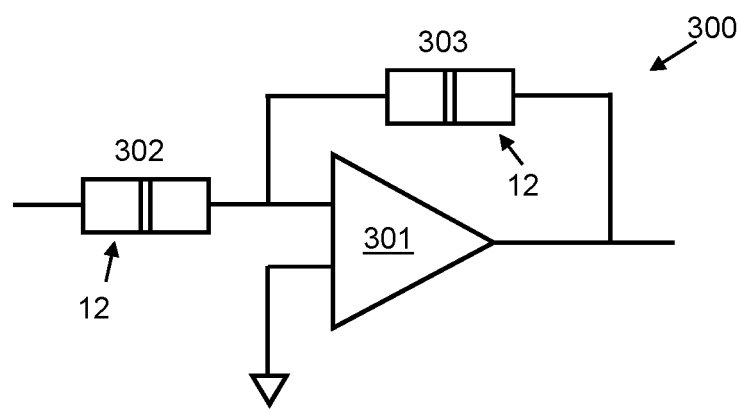

FIGS. 4(a) and (b) illustrate embodiments of multi-level memristor elements provided with programming control modules and in one instance a dynamic element matching module;

FIG. 5 illustrates a second construction of multi-level memristor element according to the present disclosure;

FIG. 6 illustrates an example configuration of the multi-level memristor element of FIG. 5;

FIG. 7 is a plot of total resistance against programmed weight for the configuration of FIG. 6;

FIG. 8 illustrates a third construction of multi-level memristor element according to the present disclosure;

FIG. 9 illustrates a fourth construction of multi-level memristor element according to the present disclosure, being a hybrid of the constructions of FIGS. 5 and 8;

FIGS. 10a and 10b illustrate a fifth and sixth constructions of a multi-level memristor element according to the present disclosure;

FIG. 11 illustrates a seventh constructions of a multi-level memristor element according to the present disclosure;

FIG. 12 is an illustration of a known example of a multiply-and-accumulate circuit;

FIG. 13 illustrates a first construction of a synapse circuit using a two-terminal multi-level memristor element according to the present disclosure;

FIG. 14 is a plot of output current against positive bits (Q) of a unary code word for an example implementation of the synapse circuit of FIG. 13;

FIG. 15 illustrates a second construction of a synapse circuit using a two-terminal multi-level memristor element according to the present disclosure;

FIG. 16 is a plot of output current against positive bits (Q) of a unary code word for an implementation of the synapse circuit of FIG. 15;

FIG. 17 illustrates a third construction of a synapse circuit using a two-terminal multi-level memristor element according to the present disclosure;

FIG. 18 illustrates a construction of a multiple-synapse circuit using a two-terminal multi-level memristor element according to the present disclosure;

FIG. 19 illustrates a construction of a neuron circuit comprising a synapse circuit using a two-terminal multi-level memristor element according to the present disclosure;

FIG. 20 illustrates a variation of a circuit using a two-terminal multi-level memristor element according to the present disclosure having a current-mode input source;

FIG. 21 illustrates a construction of a multiple-synapse circuit having a first configuration of reference path;

FIG. 22 illustrates a construction of a multiple-synapse circuit having a second configuration of reference path;

FIG. 23 illustrates a construction of a multiple-synapse circuit having a third configuration of reference path;

FIG. 24 illustrates a plot of received input code vs. current through a two-terminal multi-level memristor element according to the present disclosure, for a linear variation in element resistance;

FIG. 25 illustrates a table for the mapping of received input codes vs. programmed portions of a 4-bit memristor element for a linear variation in element resistance, and a linear variation in element conductance;

FIG. 26 illustrates a plot of received input code vs. current through a two-terminal multi-level memristor element according to the present disclosure, for a linear variation in element conductance; and FIG. 27 illustrates a construction of an amplifier circuit using multi-level memristor elements according to the present disclosure.

Figure 1:
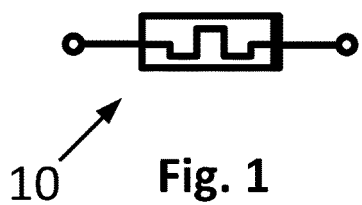
FIG. 1 illustrates a symbol for a binary memristor.
Figure 2:
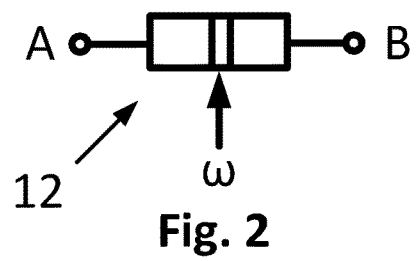
FIG. 2 illustrates a symbol for a two-terminal multi-level memristor element synthesised from binary memristors, according to an aspect of the present disclosure.

With reference to FIG. 2, a symbol for a multi-level memristor element synthesised from binary memristors is indicated at 12. The memristor element 12 comprises an input terminal A, and an output terminal B. The memristor element 12 is configured such that it may receive a signal indicative of a weighting value ω, wherein the resistance level of the memristor element 12 across the terminals A and B is variable based on the value of ω.

The multi-level memristor element 12 is synthesised from a plurality of binary memristors 10, the binary memristors 10 configured in such a way to implement an adjustable resistance, based on the weighting value ω. In other words the multi-level memristor element 12 comprises a plurality of binary memristors 10 which are configured such that resistance (or equivalently the conductance) between the terminals A and B can be selectively programmed to any of more than two different values, so as to represent the desired weighting value ω. It will be appreciated that as the binary memristors 10 can be programmed to a particular resistance state which will persist, the memristors of the multi-level memristor element 12 may be programmed, e.g. in a programming phase, to effectively store the weighting value ω. Subsequently the multi-level memristor element 12 could be used, for example as part of a computing operation, with a voltage or current applied to the terminal A so that the current or voltage at the terminal B depends, at least partly, on the weighting value ω. As will be explained in more detail below, the multi-level memristor element 12 may have one or more control inputs which may be active during a programming phase. In use, however, when an input signal of interest is applied to terminal A, the multi-level memristor element 12 will generally have already been programmed to a desired weighting value ω and there may thus be no need for the control inputs to be active. Thus the multi-level memristor element 12 can thus be seen as a two-terminal device, e.g. with an input applied to terminal A to generate an output at terminal B.

Preferably, the binary memristors of the multi-level memristor element are matched or scaled, such that the memristors have approximately the same dimensions, and/or approximately the same electrical characteristics. Such matched memristors may be provided by manufacturing the individual memristors as part of a common process. The use of memristors from a common process allows for the electrical characteristics of the memristors to be of a relatively uniform standard throughout the multi-level memristor element.

Figure 3:
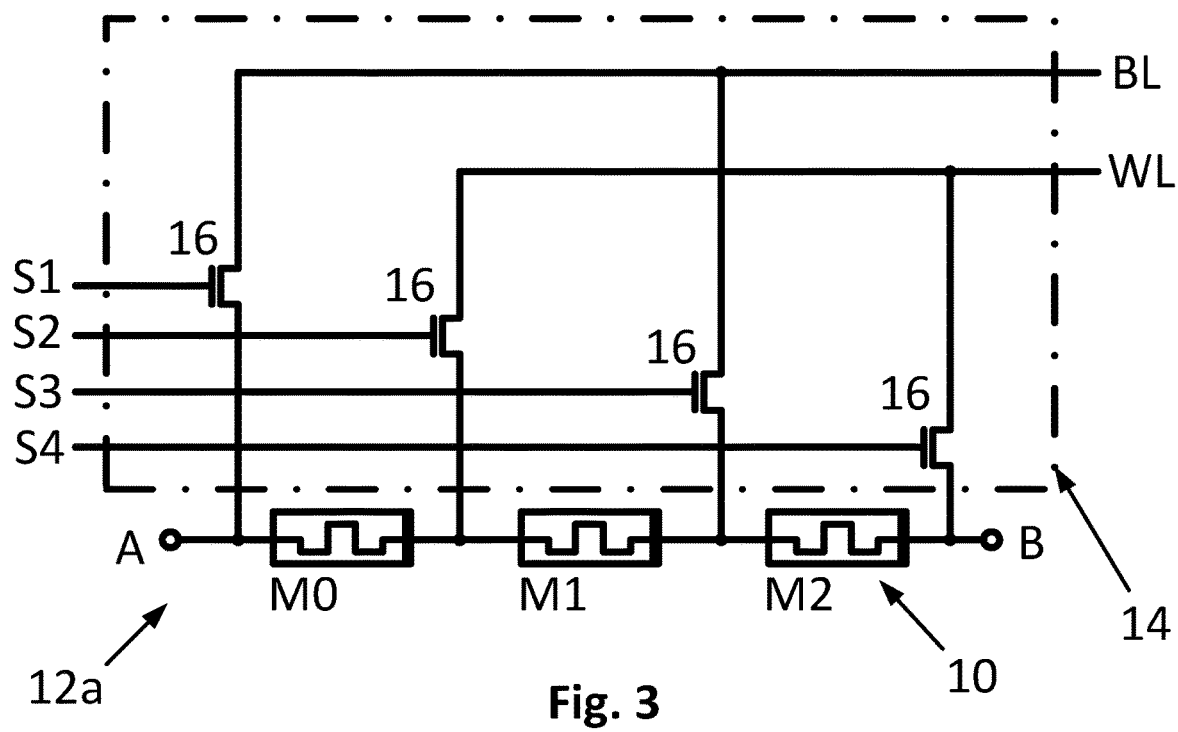
FIG. 3 illustrates a first construction of multi-level memristor element according to the present disclosure, incorporating switching circuitry.

With reference to FIG. 3, a first construction of a multi-level memristor element 12 is indicated at 12a. In the embodiment of FIG. 3, the memristor element 12a comprises a plurality of binary memristors 10 connected in series between the input and output terminals A,B, the individual binary memristors 10 referenced as M0,M1,M2. While the embodiment of FIG. 3 illustrates a system having three series-connected binary memristors 10, it will be understood that any number of binary memristors 10 may be used in the memristor element 12a, depending on the required resolution of the memristor element.

The memristor element 12a is further provided with switching circuitry indicated by broken line outline at 14, which allows for the programming of resistance states of individual binary memristors 10 by the application of suitable switching voltages or currents across the individual binary memristors 10. The switching circuitry 14 comprises a plurality of switches, in this case MOSFET switches 16. The MOSFET switches 16 are each connected with a node of the series-connection of binary memristors 10, with alternating connections to different control inputs, in this example a Bit Line (BL) and a Word Line (WL). The gate of each MOSFET switch 16 is connected to separate control inputs, e.g. to receive control signal S1,S2,S3,S4. Based on the weighting value ω, by appropriate control of the Bit Line (BL) and Word Line (WL), and of the individual control signals S1,S2,S3,S4, accordingly the voltage or charge applied across each of the individual binary memristors 10 can be adjusted to individually program each of the binary memristors 10 between a high (HI) resistance state and a low (LO) resistance state. Accordingly, the overall resistance of the memristor element 12a can be configured by switching of the signals S1,S2,S3,S4,BL and WL.

It will be understood that the binary memristors may be programmed to the desired resistance state HI or LO by application of a suitable voltage of a sufficient magnitude. In general a voltage of a first polarity and magnitude may be applied to programme the memristor to one state, say HI, and a voltage of opposite polarity but the same or similar magnitude may be applied to programme the memristor to the other state, say LO. The voltages of the bit line and word line may thus be controlled to voltages that differ by the required programming voltage and the switches across each memristor controlled appropriately to generate a voltage of appropriate polarity across the memristors to be programmed to a particular state.

The switches are also controlled to prevent applying an unwanted voltage of sufficient magnitude across a memristor which it is not desired to programme at that time. In some embodiments, if a first memristor is being programmed to one state, and thus has a voltage applied to a node of the series connection to generate a voltage of one polarity across the first memristor, the voltage applied to the first node may also be applied to a second, adjacent memristor of the series connection. In this case the voltage on the other side of the second adjacent memristor may be controlled to a level such that voltage across the second memristor is lower than the magnitude required from programming. In some examples the switching circuitry 14 could be configured to connect one side of a memristor which is not to be programmed to an intermediate bias level such that the voltage across that memristor will be lower than the magnitude required for programming.

With reference to FIG. 4(*a*), the memristor element 12*a* may be provided with a programming control module (PCM) 17 which receives a weighting value ω and interprets or converts the weighting value ω into an appropriate programming configuration for the switching circuitry 14. The programming configuration is calculated to set the HI and LO resistance states of the binary memristors M0,M1, M2 to provide an overall resistance of the memristor element 12*a* corresponding to the weighting value ω. An alternative control scheme which can be implemented by the programming control module 17 will be described below. It will be understood that the PCM 17 may be provided as an integrated component of the memristor element 12*a*, or may be provided as an adjacent component which is configured to interface with the switching circuitry 14 of one or more memristor elements. Thus, in some examples the multi-level memristor element 12*a* may receive the weighting value ω itself, in any suitable form, and derive suitable control signals for the switching circuitry 14. In other examples the multi-level memristor element 12*a* may receive suitable control signals at the control inputs to control programming of the multi-level memristor element 12*a*. It will be understood of course that such control signals are themselves indicative of the desired weighting value ω.

It will also be understood that the weighting value ω may, in some embodiments, only be actively provided to the PCM 17 for a programming phase, for example if it is needed to reconfigure the multi-level memristor element 12*a* to store a new weighting value ω. Once suitably programmed, the multi-level memristor element 12*a* may effectively store the weighting value ω. In some examples however the PCM may be configured to periodically transition the multi-level memristor element 12*a* between different configurations that correspond to the same weighting value ω, for dynamic matching or error reduction purposes, as will be described in more detail below, in which case the PCM may retain or continue to receive an indication of the required weighting value ω. It will be understood that references in this disclosure to receiving a weighting value will include receiving a weighting value at just one or more points in time ahead of a respective programming phase, which may occur prior to a computing phase in which a signal of interest is applied to terminal A to generate an output at terminal B as part of a compute operation. References herein to receiving a weighting value also include retrieving some indication of the weighting value from some other memory of a host device.

The construction of FIG. 3 is suitable for implementation of a unary coding scheme, wherein the weighting value ω is received as or converted to a unary code word defining the desired resistance level of the memristor element 12*a*. Unary coding is where each bit has the same effect on overall resistance, for instance a thermometer coding technique. In at least some implementations, for an ideal memristor element, a LO resistance state would have a resistance of 0 ohms. However, current memristor manufacturing processes result in memristors having non-zero resistance level in the LO resistance state, but with a resistance which is reduced compared to that in the HI resistance state. Accordingly, the information encoded by the memristor element can be seen by the change in the resistance level between the HI and LO resistance states, referred to herein as the (delta R) of the memristor. Circuits configured to track the (delta R) of the memristor, particularly synapse circuits for artificial neural networks, are described in further detail below.

As the binary memristors 10 may be subject to process variations resulting in inconsistencies in the exact values of the resistances of the binary memristors 10, in some embodiments the multi-level memristor element 12*a* of FIG. 3 may be arranged to facilitate dynamic element matching (DEM). With reference to FIG. 4(*b*), the memristor element 12*a* is provided with a DEM module 18 which is configured to receive the indication of the weighting value ω, which may, for example, be in the form of a unary code word, and to control the PCM 17 and the switching circuitry 14 to program the binary memristors M0,M1,M2 such that for a particular unary code word, the assignment of the bits of the code word among the binary memristors 10 of the multi-level memristor element 12*a* is periodically varied (where possible). For instance the assignment of the bits of the code word among the binary memristors 10 of the multi-level memristor element 12*a* may be rotated or varied for a number of cycles of that particular code word. By rotating or varying the bit assignments of the code word among the binary memristor portions, accordingly any mismatches of electrical characteristics between binary memristor portions is compensated for or rotated out of the resultant output signal. The DEM module 18 may be configured to rotate the bit assignment of the weights at a greater or lesser frequency than the input data rate.

While the embodiment illustrated in FIG. 3 is particularly suited to implement a unary-coded variable resistance element, other constructions may be used for the implementation of a binary-coded variable resistance element.

With reference to FIG. 5, a second construction of a multi-level memristor element 12 is indicated at 12*b*. In the embodiment of FIG. 5, the memristor element 12*b* comprises a plurality of binary memristor portions demarcated by the broken lines of FIG. 5, the binary memristor portions comprising binary memristors 10 connected in series between the input and output terminals A,B, the individual binary memristors 10 referenced as M0,M1,M2,M3. While, in this example, the first binary memristor portion comprises a single binary memristor M0, the subsequent series-connected binary memristor portions each comprise a resistance R1,R2,R3, referred to herein as a shunt resistance, connected in parallel with the respective binary memristors M1,M2, M3. FIG. 5 illustrates each shunt resistance R1, R2, R3 as a single resistor for clarity but it will be appreciated that the shunt resistance may be implemented by more than one resistance in any suitable configuration, e.g. in series, parallel or some series-parallel combination.

For the purposes of clarity, the switching circuitry used to control the programming of the individual binary memristors 10 is omitted from FIG. 5, but it will be understood that the switching circuitry 14 illustrated in FIG. 3 and the PCM 17 illustrated in FIGS. 4(*a*) and 4(*b*) may be adapted for use in the system of FIG. 5.

Again the memristor of each binary memristor portion may be programmed to a selected one of the HI and LO resistance states. However in this embodiment the parallel shunt resistances R1,R2,R3 for each relevant portion can be set to tune the (delta R) of the respective binary memristor portion to a desired value. In other words, the difference in effective resistance of a binary memristor portion between the state in which the relevant memristor is in the HI resistance state compared with the state in which that memristor is in the LO resistance state depends not only on the (delta R) of the memristor itself, but also the value of the shunt resistance (for those memristor portions with a shunt resistance).

For example, the resistance R(L) of the binary memristor portion comprising M1 and R1 when M1 is in the LO resistance state is determined as follows:

$$R_L = \frac{R_1 R_{LOW}}{R_1 + R_{LOW}}$$

Where R(low) is the resistance of the binary memristor M1 when in the LO resistance state.

When M1 is in the HI resistance state, the resistance R(H) of the binary memristor portion comprising M1 and R1 when M1 is in the HI resistance state is determined as follows:

$$R_H = \frac{R_1 \cdot (R_{LOW} + \Delta R)}{R_1 + R_{LOW} + \Delta R}$$

where ΔR is the (delta R) for the binary memristor itself, i.e. the difference in resistance between the HI and LO resistance states of the binary memristor alone. This provides a resultant (delta R) for the binary memristor portion (including the binary memristor and the shunt resistance) equal to R(H)–R(L).

Accordingly, the system can be configured such that there is a specific difference in the effective resistance of a binary memristor portion between the HI and LO resistance states of the binary memristor. By tailoring the system appropriately, the system can allow for data to be encoded to follow a specified output relationship. E.g. for a linear change in the memristive element impedance between successive binary codes, the difference between the HI and LO resistive states of a binary memristor portion should be:

$$\frac{\Delta R}{2^m}$$

where m indicates how far along the encoding bit word the binary memristor portion is located (i.e. what bit of the code word is the binary memristor portion to implement). It will of course be understood that if the first portion itself were to include a shunt resistance, the ΔR in the equation above would be the effective (delta R) for the first memristor portion. It will also be understood that the relative order of the various memristor portions in the series connection could be varied for this example, and the examples described below.

FIG. 6 illustrates an example construction of a 3-bit synthesised multi-level memristor element 12c, based on the general architecture of FIG. 5.

For binary memristors M0,M1,M2 having R(low)=2 kΩ and (delta R)=2 kΩ, where the memristor M0 is used to implement the Most Significant Bit (MSB) of the binary code word, M1 implements the next bit of the binary code word, and M2 implements the Least Significant Bit (LSB) of the binary code word.

Accordingly, the effective (delta R) for the binary memristor portions corresponding to the first bit position, i.e. that portion having just the series-connected binary memristor M0 is 2 kΩ. To provide a binary scaling of the effective (delta R) for the successive binary memristor portions, accordingly the effective (delta R) for the binary memristor portion comprising memristor M1 and shunt resistor R1 should be 1 kΩ, and the effective (delta R) for the binary memristor portion comprising memristor M2 and shunt resistor R2 should be 500Ω. To produce such effective (delta R) values, accordingly R1 is selected as 7 kΩ and R2 is selected as 3 kΩ.

The resultant two-terminal multi-level memristor element 12c implements an effective variation of resistance across the two terminals A,B of the element 12c based on a 3-bit binary code word to control the switching of the individual binary memristor portion of the element. A plot of the variation of resistance against the decimal equivalent of the binary code (or weighting) is shown in FIG. 7.

A third construction of a multi-level memristor element 12 is indicated at 12d of FIG. 8. In the embodiment of FIG. 8, the memristor element 12d comprises a plurality of binary memristor portions arranged in series between the input and output terminals A,B, the binary memristor portions demarcated by the broken lines of FIG. 8. In the embodiment of FIG. 8, the first binary memristor portion comprises of a single binary memristor M0, while the subsequent series-connected binary memristor portions each comprise banks of binary memristors connected in parallel, resulting in a first bank of the parallel memristors M1, a second bank of the parallel memristors M2, and a third bank of the parallel memristors M3.

Figure 4B:
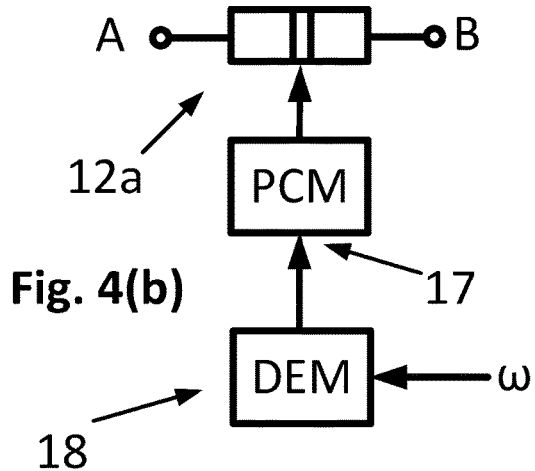

For the purposes of clarity, the switching circuitry used to control the programming of the individual binary memristors 10 is omitted from FIG. 8, but it will be understood that the switching circuitry 14 illustrated in FIG. 3 and the PCM 17 illustrated in FIGS. 4(a) and 4(b) may be adapted for use in the system of FIG. 8. In this case, it will be understood that the memristors of each individual binary memristor portion comprises are commonly programmed between the HI and LO resistance states, so that each binary memristor portion is programmed between an effective HI and LO resistance state.

In this construction, the numbers of parallel-connected binary memristors per binary memristor portion increases by a factor of two for each successive portion, thereby ensuring that the effective (delta R) for the individual binary memristor portions follows a binary scale. Accordingly, where the binary memristors of FIG. 9 are all from a common process, the first binary memristor portion having a single memristor M0, has an effective (delta R) corresponding to the (delta R) of the memristor M0, while the second binary memristor portion having a pair of memristors M1 in parallel has an effective (delta R) corresponding to:

$$\frac{\Delta R}{2}$$

Similarly, the fourth binary memristor portion, comprising eight memristors M3 in parallel and representing the Least Significant Bit (LSB) of a 4-bit binary code word, has an effective (delta R) of:

$$\frac{\Delta R}{8}$$

Accordingly, the construction illustrated in FIG. 8 provides an effective linear variation of resistance across the two terminals A,B of the element 12d, based on a 4-bit binary code word to control the switching of the individual binary memristor portion of the element.

While the embodiment of FIG. 8 illustrates a system having four binary memristor portions, it will be understood that any number of binary memristor portions may be used in the memristor element 12d, depending on the required resolution of the memristor element.

In some embodiments, where the system is intended to implement effective coding of relatively long code words, the use of banks of parallel memristors may require considerable area to implement, to accommodate multiple binary memristors. In such situations, a hybrid construction of binary memristor portions may provide a balance between the power consumption and area of a multi-level memristor element.

With reference to FIG. 9, an example of such a construction is illustrated, for a memristor element 12e. The memristor element 12e comprises a plurality of binary memristor portions arranged in series between the input and output terminals A,B, the binary memristor portions demarcated by the broken lines of FIG. 9.

In the embodiment of FIG. 9, the first binary memristor portion comprises of a single binary memristor M0, the second binary memristor portion comprises a bank of two binary memristors M1 connected in parallel, the third binary memristor portion comprises a bank of four binary memristors M2 connected in parallel, and the fourth and fifth binary memristor portions respectively comprise binary memristors M3, M4, connected in parallel with respective shunt resistances R3, R4. The values of the shunt resistances R3, R4 are selected such that the effective (delta R) of the fourth and fifth binary memristor portions are scaled relative to the effective (delta R) of the first, second and third binary memristor portions.

For example, assuming the binary memristors of the element 12e are from a common process, accordingly the effective (delta R) for the first, second and third binary memristor portions can be easily seen to be respectively equal to:

$$\Delta R, \frac{\Delta R}{2}, \frac{\Delta R}{4}$$

For a linear scaling of the effective (delta R) with code, the shunt resistance R3 is selected such that effective (delta R) of the fourth binary memristor portion as the memristor M3 is switched between the HI and LO resistance states is half that of the effective (delta R) of the third binary memristor portions, i.e.

$$\frac{\Delta R}{8}$$

With the shunt resistance R4 selected such that the effective (delta R) of the fifth binary memristor portion as the memristor M4 is switched between the HI and LO resistance states is equal to:

$$\frac{\Delta R}{16}$$

It will be understood that the switching circuitry is omitted from the illustration of FIG. 9, but switching circuitry similar to the switching circuitry 14 as shown in FIG. 3 and the PCM 17 illustrated in FIGS. 4(a) and 4(b) may be used to control the programming of the individual binary memristors of the element 12e according to the 5-bit binary code word to be programmed to the element 12e.

A further example construction of a multi-level memristor element 12 is indicated at 12f of FIG. 10a. In the embodiment of FIG. 10a, the memristor element 12f comprises a plurality of binary memristor portions between the input and output terminals A,B, the binary memristor portions demarcated by the broken lines of FIG. 10a. In the embodiment of FIG. 10a, the first binary memristor portion comprises of a single binary memristor M0 while the subsequent binary memristor portions each comprise a binary memristors M1 to M4 and a respective shunt resistance R1 to R4. In the example of FIG. 10a the memristors of each portion are connected in series with one another, but at least some of the respective shunt resistances of the memristor portions are connected in parallel with more than one of the memristors M1 to M4. In the example of FIG. 10a, the shunt resistance R1 is connected in parallel with the series combination of memristors M1, M2, M3 and M4, the shunt resistance R2 is connected in parallel with the series combination of memristors M2, M3 and M4, the shunt resistance R3 is connected in parallel with the series combination of memristors M3 and M4 and the shunt resistance R4 with memristor M4 alone. Thus, for the whole multi-level memristor element 12f, the shunt resistances are effectively arranged in a nested configuration. As will be understood by one skilled in the art, the effect of at least some shunt resistances are thus effectively applied across multiple memristors. By nesting the shunt resistances in this way, a suitable scaling of the (delta R) for the memristor portions, can be achieved without requiring such a big difference in the values of the individual shunt resistances.

In this example each binary memristor portion includes a memristor, and the memristors of the portions are connected in series between input terminal A and output terminal B. The binary memristor portions can thus be seen to be connected in series. Each binary memristor portion other than the first also has a corresponding shunt resistance, where the relevant shunt resistance is connected in parallel with the relevant memristor (either that memristor on its own or the series connection of that memristor with the memristors of other portions) and one terminal of the relevant shunt resistance is connected to one terminal of the relevant memristor by a path that does not include the memristor or shunt resistance of another memristor portion.

It will be noted that whilst FIG. 10a illustrates that the shunt resistance for a given portion is coupled in parallel across the memristor of that portion and all subsequent portions. Other arrangements are possible however, for instance in another arrangement R1 could be coupled across just memristor M1, R2 could be coupled across both M1 and M2, R3 could be coupled across M1, M2 and M3 and so on. In each case however each binary memristor portion (other than, in this example, the first) includes a memristor and a connection to one shunt resistance.

Whilst FIG. 10a illustrates the binary memristor portion comprising series connected resistor and nested parallel shunt resistances, in some examples the position of at least some of the memristors and corresponding shunt resistances could be swapped.

A further example construction of a multi-level memristor element 12 is indicated at 12g of FIG. 10b. In the embodiment of FIG. 10b, the memristor element 12b comprises a plurality of binary memristor portions between the input and output terminals A,B, the binary memristor portions demarcated by the broken lines of FIG. 10b. In the embodiment of FIG. 10b, the first binary memristor portion comprises of a single binary memristor M0 while the subsequent binary memristor portions each comprise a binary memristors M1 to M4 and a respective shunt resistance R1 to R4. In the example of FIG. 10a the resistances R1 to R4 of each portion are connected in series with one another, but the respective memristors M1 to M4 of the memristor portions are connected in parallel with more than one of the resistances R1 to R4. This construction provides a nested configuration of the memristors across the shunt resistances. Again it will be appreciated that other arrangements are possible.

In this arrangement it will be understood however that the switching circuitry 14 described above may have a different arrangement to that described with respect to FIG. 3, with the plurality of switches providing connections to either side of the memristors of a binary memristor portion to allow for suitable programming.

Again it will be understood that each binary memristor portion comprises a component in series with components of the other binary memristor portions between the terminals A and B and the binary memristor portions are therefore connected in series. For the second and subsequent portion there is also a connection to another component which is coupled in parallel with the relevant series connected component and possibly one or more of the series connected components of the other binary memristor portions.

In the examples discussed above the multilevel memristor element 12 comprises a plurality of binary memristor portions, each of which can be programmed individually to provide a selectively variable resistance for that portion. As discussed above the binary memristor portions may be configured such that the variation in resistance of the binary memristor portions are scaled with respect to one another in a defined way, for instance with a binary scaling. In the examples discussed above the binary memristor portions are connected in series.

In some embodiments however the multilevel memristor element 12 may comprise a plurality of binary memristor portions connected in parallel with one another, where each binary memristor portion comprises at least one binary memristor and is independently programmable to adopt one of two resistance values for that portion. The binary memristor portions may be scaled so as to provide a desired scaling factor between the parallel connected memristor portions.

A further construction of a multi-level memristor element 12 is indicated at 12h of FIG. 11. In the embodiment of FIG. 11, the memristor element 12h comprises a plurality of binary memristor portions between the input and output terminals A,B, the binary memristor portions demarcated by the broken lines of FIG. 11. In the embodiment of FIG. 11 however the binary memristor portions are connected in parallel between the terminals A and B.

In a similar manner as discussed above the binary memristor portions may have different configurations to provide different scaled variations in resistance.

In the embodiment of FIG. 11 one binary memristor portion comprises a single binary memristor M2. In this example at least some of the binary memristor portions comprises different number of binary memristors in series. In this example one binary memristor portion comprises two series connected binary memristors M1 and another portion comprises four series connected memristors M1. In use all of the binary memristors of the portion are selectively controlled to the same state HI or LO.

It will therefore be understood that this provides a scaled (delta R) for the different memristor portions. Thus the effective (delta R) for the portion comprising the single memristor M2 will be equivalent to the $\Delta R$ of the binary memristor itself. The effective (delta R) for the portion comprising the two series connected memristors M1 will be equal to $2\Delta R$ and the effective (delta R) for the portion comprising the four series connected memristors M0 will be equal to $4\Delta R$.

In this example at least some of the binary memristor portions comprises a bank of binary memristors in parallel. In this example one binary memristor portion comprises a bank of two parallel binary memristors M3 and another portion comprises a bank of four parallel binary memristors M4. In use all of the binary memristors of the portion are selectively controlled to the same state HI or LO.

This also provide a scaling of the effective (delta R) of the binary memristor portions. It will be appreciated that the effective (delta R) for the portion comprising the bank of two parallel memristors M3 will be equivalent to $\Delta R/2$ of the binary memristor itself. The effective (delta R) for the portion comprising the bank of four parallel memristors M4 will be equal to $\Delta R/4$.

In use the individual binary memristor portions may be individually programmed, by programming all the memristors of that portion to the same of the high state or the low state. If, in use, a defined voltage is applied to the input terminal A the contribution to the current at terminal B for each individual memristor portion will depend on its selected resistance state and the scaling for that portion.

For the purposes of clarity, the detailed switching circuitry used to control the programming of the individual binary memristors 10 is omitted from FIG. 11, but it will be understood that the switching circuitry 14 illustrated in FIG. 3 and the PCM 17 illustrated in FIGS. 4(a) and 4(b) may be adapted for use in the system of FIG. 11. In some examples however, to program an individual binary memristor portion suitable programming voltages could be applied to the input and output terminals A and B to programme all the memristors of the binary portion to the desired state. To avoid unwanted programming of a binary memristor portion each binary memristor portion may comprise at least one programming switch PS which can isolate that binary memristor portion from at least one of the applied voltages, in which case the programming switch may instead couple the binary memristor portion to an intermediate voltage. To programme the binary memristor portions comprising a plurality of memristor portions a switch arrangement such as discussed with reference to FIG. 3 may be used to apply suitable voltages to each individual memristor of the series connection.

It will be understood that FIG. 11 illustrates just one example and other configurations may be implemented. For instance some binary memristors portions could comprise a shunt resistance in parallel with one or more binary resistors or vice versa. In general any of the variants of a binary memristor portion discussed above may be implemented binary memristor portion in parallel with another binary memristor portion.

In a preferred aspect, the multi-level memristor element 12,12a,12b,12c,12d,12e, 12f, 12g, 12h is used as part of a multiply-and-add circuit. In one aspect, the multi-level memristor element 12,12a,12b,12c,12d,12e, 12f, 12g, 12h is used as part of a synapse circuit for use in artificial neural networks. Description of how a multi-level memristor element may be incorporated into appropriate circuits will now be provided.

With reference to FIG. 12, the general principle for the incorporation of memristors into a multiply-and-add circuit is illustrated based on Kirchhoff's current law. A pair of input voltages V1 and V2 can be applied across respective signal input paths each having a series resistance G1 and G2 respectively. Based on Ohm's law (V=IR), the resultant current I1 and I2 flowing in the respective paths is based on the voltage divided by the resistance. The paths can then be connected together to provide a total output current I3, which is the sum of currents I1 and I2.

By providing a resistive element where the resistance level can be set by a user, e.g. a memristor, accordingly the circuit as shown in FIG. 12 can be the basis for multiple multiply-and-add operations, wherein resistive weighting values are applied to input voltages to provide weighted output currents.

FIG. 13 provides an illustration of a possible configuration of synapse circuit using multi-level memristor elements 12. A first memristor element 12' is provided as part of a first data path 20, wherein an input voltage V1 is applied to the memristor element 12', providing resultant data output current I1.

Ideally memristor element 12' would have 0 ohms impedance in its LO resistance state. In practice, a memristor will have some non-zero resistance level when in the LO resistance state, which will give rise to a data-dependent offset current. To account for such an offset current, a second data path 22 is provided having a second memristor element 12", which provides a second data output current I2. The resultant output current I(out) is based on a combination of the currents I1 and I2, such that any data-dependent offset current is accounted for in the output.

In an example configuration, where the multi-level memristor elements 12',12" are synthesised from a plurality of binary memristors 10 to implement unary coding, as described above with reference to memristor element 12a of FIGS. 3 and 4, the first path 20 is configured such that the resultant data output current I1 has a value coded by Q binary memristors 10 of the memristor element 12' being in the HI resistive state plus the data-dependent offset current.

In the second path 22, all of the binary memristors 10 of the memristor element 12" are set to the LO resistive state, to provide a reference output current I2. As a result, the values of the currents I1 and I2 are determined as follows:

$$I_1 = \frac{V1}{N*R_{LOW} + Q*\Delta R}$$

$$I_2 = \frac{V1}{N*R_{LOW}}$$

Where N is the number of binary memristors of the memristor elements 12',12"; ΔR (delta R) is the effective difference in the resistance level of the binary memristors 10 of the memristor elements 12',12" between the HI and LO resistive states; and R(low) is the resistance level of the binary memristors 10 of the memristor elements 12',12" when the binary memristors 10 are in the LO resistive state.

Calculating the resultant output current I(out) based on the difference between I1 and I2 gives:

$$I_{out} = I_2 - I_1 = \frac{Q\Delta R}{QN\Delta R R_{LOW} + N^2 R_{LOW}^2}$$

Accordingly, the difference between the currents I1 and I2 provides the information as to the encoding or weighting applied to the input voltage V1, based on the (delta R) of the binary memristors 10 in the first path that are set to the HI resistive state, allowing for I(out) to be representative of the input voltage times a weighting value applied to the multi-level memristor element 12' to control the resistance level of the element 12'.

For an example construction of the configuration of FIG. 13, the relationship between the value of code Q and the current I1 is shown in FIG. 14. As a result, it can be seen that the relationship between code and current is non-linear.

In an effort to linearize the system of FIG. 13, the configuration as shown in FIG. 15 may be used. In FIG. 15, the first and second paths 20,22 are supplemented by the addition of respective offset resistors R0 in series with the respective memristor elements 12',12". As a result, the absolute value of the current flowing through the respective data paths 20,22 can be limited. In this construction, the separate currents in the data paths 20,22 are calculated as follows:

$$I_1 = \frac{V1}{r0 + N*R_{LOW} + Q*\Delta R}$$

$$I_2 = \frac{V1}{r0 + N*R_{LOW}}$$

Accordingly, the resultant output current is calculated as follows:

$$I_{out} = I_2 - I_1 = \frac{Q*\Delta R}{(r0 + N*R_{LOW})(r0 + Q*\Delta R + N*R_{LOW})}$$

Ideally r0>>N*R(high), where R(high) is the resistance of the memristor element when in the HI resistive state. For an example construction of the configuration of FIG. 15, the relationship between the value of Q and the current I1 is shown in FIG. 16, which can be shown to provide a relatively linear relationship between the value of the code word applied to the memristor element 12' and the output current.

While the embodiment shown in FIGS. 13 and 15 show an offset resistor r0 is provided in series with the multi-level memristor elements 12',12" used to implement unary coding, it will be understood that the use of a series-connected offset resistor may equally be used when using memristor elements to implement binary coding. It will further be understood that additionally or alternatively an offset resistance R0 may be incorporated as part of the construction of the multi-level memristor elements 12,12a,12b,12c,12d,12e, 12f, 12g, 12h in series with the binary memristor portions of the respective elements.

A measure of the efficiency μ of the above construction can be determined by comparing the differential signal to the common mode signal:

$$\mu = \frac{I_2 - I_1}{I_2 + I_1} = \frac{Q\Delta R}{2r0 + Q\Delta R + 2NR_{LOW}}$$

While the above embodiments of synapse circuit describe the binary memristors of the second memristor element 12" as being set at the LO resistance state to define a reference current for use in the determination of the output current, it will be understood that the second memristor element 12" may be set at any suitable offset value, e.g. where the binary memristors of the second memristor element 12" are all set at the HI resistance state, or the memristors are set a combination of HI and LO states at a pre-defined resistance state between fully HI and fully LO.

In a further aspect, the synapse circuit may be provided as a differential system, wherein data is applied through both the first and second paths of the synapse circuit, with the resistance level of the memristor elements in both paths varied accordingly. For example, the synapse circuit may be configured as shown in FIG. 17, where a positive data input voltage (+V1) is applied to a first path 120, while a negative data input voltage (−V1) is applied to a second path 122. In this case, the weighting applied through memristor elements 124 and 126 is coded to reflect the positive and negative aspects of the input signals.

In this configuration, we have:

$$IN = \frac{-V1}{N*R_{LOW} + \left(\frac{N}{2} + K\right)*\Delta R}$$

$$IP = \frac{V1}{N*R_{LOW} - \left(\frac{N}{2} - K\right)*\Delta R}$$

Where K is the input code defining the memristive element state, and where the output current can be defined as follows:

$$Iout = \frac{4NV1\Delta R}{(2K\Delta R - N\Delta R + 2NR_{LOW})((2K+N)\Delta R + 2NR_{LOW})}$$

This may be linearized with the addition of appropriate offset resistors r0 as described above. If offset resistors r0 are used, the output current can be calculated as follows:

$$Iout = \frac{4NV1\Delta R}{(2R0 + 2K\Delta R - N\Delta R + 2NR_{LOW})(2R0 + (2K+N)\Delta R + 2NR_{LOW})}$$

Applying the measure of the efficiency of this differential construction gives the following:

$$\mu = \frac{I_P - I_N}{I_P + I_N} = \frac{2(R0 + K\Delta R + NR_{LOW})}{N\Delta R}$$

Accordingly, the differential construction may be more efficient than the single-ended reference system described above with reference to FIG. 15.

While the above embodiments of synapse circuit act to apply a weighting to a single input voltage, it will be understood that multiple-synapse configurations may be used to perform a multiply-and-add operation on two or more separate input voltages. An example of such a multiple synapse cell is illustrated in FIG. 18, where two input voltages V1 and V2 are applied in a differential manner via respective positive and negative data paths comprising memristor elements 124,126,128,130. The resultant currents from the positive and negative paths IP and IN are then used to provide the resultant output current I(out) as described above.

In FIG. 19, a variation of neuron circuit is indicated at 100, wherein multiple single-ended configurations of synapse circuits are used for a multiply-and-add operation on multiple input voltages (as indicated by V(alpha)) to provide multiple parallel resultant output currents (as indicated by ((alpha)). The output currents R(alpha) are provided as inputs to a non-linearity module 102 to provide a single output signal 104, which may be used as an output of a neural network and/or as an input to other neuron circuits.

In this configuration, the individual memristor elements ME1,ME2 of the first and second data paths are coded to account for the single-ended approach.

While the embodiments of synapse circuit above are described as receiving an input voltage, it will be understood that the data input signal may be provided as a current source input signal. With reference to FIG. 20, an input voltage for an example synapse circuit may have a Norton equivalent current source Is which is provided with a shunt resistance R1. The output of the current source Is is varied to achieve the desired input to the memristor element 104 of the synapse circuit.

In some embodiments, the shunt resistance R1 may be replaced with the first binary memristor portion of the memristor element 104, e.g. with shunt resistance R1 replaced by the binary memristor M0 as shown in FIG. 5, 6, 8, 9, 10a or 10b.

In a further aspect of the present disclosure, the reference resistance path, for example as described with reference to FIG. 12 above, may be replaced or adjusted to account for different use cases. For example, FIGS. 20-22 illustrate different configurations of circuits when multiple synapse circuits are combined to provide multiple multiply-and-add operations.

In FIG. 21, input voltages V1 and V2 are applied to separate data paths having respective memristor elements 200 and 202, with the subsequent output currents summed to provide current I(t). Separately, the inverse of the input voltages −V1 and −V2 are applied to separate reference paths having respective memristor elements 204,206 programmed to a reference resistance value, with the subsequent output currents summed to provide current I(ref). Accordingly, the currents R(t) and I(ref) are added to provide the output current I(out) which is compensated for the offset current present in the system due to the memristor construction.

In an alternative configuration, in FIG. 22 the separate memristor elements 204,206 of the reference paths of FIG. 21 are replaced by a single reference path having a single reference memristor element 208, where the inverse of the input voltages −V1 and −V2 are summed and applied to the reference path to provide the subsequent reference current I(ref). The value of reference memristor element 208 in this embodiment is selected to provide the same I(ref) as the circuit of FIG. 21, i.e. the resistance level of reference memristor element 208 is set to the reference resistance value.

In a further alternative configuration, in FIG. 23 the reference path with a reference memristor element is replaced with a single current source Is, wherein Is is configured to provide a reference current equivalent to the reference current of the other embodiments. I.e. the current source Is outputs a reference current such that:

$$Is = \frac{(-V1 - V2)}{Rref} = Iref$$

Where Rref is the reference resistance value.

It will be understood that other configurations of synapse circuit or neuron circuit may be provided. In a further aspect, it will be understood that the input voltage for the synapse circuit may be provided as a continuously-varying voltage level. Additionally or alternatively, the input voltage for the synapse circuit may be provided as a bi-level data signal, e.g. from a PWM or Sigma Delta data stream.

In a further aspect of the present disclosure, the program control module PCM 17 may be configured to perform an intermediate mapping of the received input code or weighting w to the eventual programming scheme used for the memristor element, to provide for a desired operation of the memristor element.

In general, a linear change in the number of binary memristor portions of a memristor element that are programmed to the HI or LO resistance state may translate into a linear change in total resistance. However, depending on the circuit, a linear change in resistance may not translate into a linear change in conductance.

For example, FIG. 24 illustrates a sample plot of current vs. input code or weighting w through a multi-level memristor element, for a unary code to implement weighting values between 1-16. It will be understood that the current is directly proportional to the conductance of the memristor element, which is in part defined by the number of binary memristor portions of the memristor element that are programmed to the HI or LO resistive states. For a linear unary coding, each successive bit indicates that an additional binary memristor portion of the memristor element is switched between the resistive states.

The solid line of FIG. 24 indicates an ideal code-to-current system, wherein each increase in the input code translates to an equal step change of approximately 1 uA of current, providing a linear relationship between code and output current (or conductance). However, due to the system configuration, the conductance of the memristor element scales non-linearly with a linear increase in input code, resulting in the relationship between code and output current illustrated by the broken line of FIG. 24.

In a preferred embodiment, the program control module of the memristor elements of the present disclosure, as illustrated at PCM 17 in FIGS. 4(*a*) and 4(*b*), is configured to perform an intermediate mapping of the input code or weighting w to the actual programmed codes of the memristor element, to provide for a linear variation in device conductance based on the received input code. With reference to the table of FIG. 25, the variation in received input code directly translates into a linear change in the total resistance of the memristor element, but a non-linear translation is required to provide a linear change in conductance.

The first column of FIG. 25 shows the input code or weighting w received by the PCM 17. The second column illustrated the programming performed to provide a linear variation in resistance of the memristor element—for example, for input code 1, only one binary memristor portion is switched to a HI resistive state, while for input code 16 then accordingly 16 binary memristor portions are switched to the HI resistive state. The third column illustrates the programming performed to provide an approximate linear change in conductance—for example, for input code 1, no binary memristor portions switched to the HI resistive state, while for input code 10 accordingly 8 binary memristor portions are switched to the HI resistive state.

With reference to FIG. 26, such a non-linear mapping provides a curve fitting of the current-to-code relationship, when compared with the ideal code-to-current system. As with FIG. 24, the solid line of FIG. 26 indicates an ideal code-to-current system, wherein each increase in the input code translates to an equal step change of approximately 1 uA of current, while the broken line of FIG. 26 indicates the code-to-current relationship for a memristor element where the code inputs are mapped to different assignments of binary memristor portions to provide an approximately linear variation of element conductance with input code.

While the above description provides for a correction or mapping of the received input codes to provide for a linear variation in conductance of the memristor element, it will be understood that other mapping configurations may be applied by the PCM 17, depending on the system use-case and desired performance.

As discussed above a multi-level memristor element 12 such as described in any of the variants herein may be advantageously used in a neuromorphic computing circuit, for instance as part of an artificial neural network (ANN), e.g. as a synapse circuit. A multi-level memristor element according to any of the variants described herein may, however, be usefully employed in other applications, and may be useful in any application where it may be desirable to be able to program an element of a circuit to any of a number of different resistance values that may persist in the absence of applied power.

Embodiments thus also relate to multi-level memristors implemented in other circuitry, e.g. general purpose circuitry. For instance, multi-level memristors such as any of the multi-level memristors elements 12*a*, 12*b*, 12*c*, 12*d*, 12*e*, 12*f*, 12*g*, 12*h* described above may, in one example be used to implement a programmable gain.

FIG. 27 illustrates an example of amplifier circuitry 300 comprising an amplifier 301. In this example an input signal may be applied to the amplifier 301 via an input resistance 302. There may also be a feedback resistance 303. At least one of the input resistance 302 and the feedback resistance 303 may be implemented by a multi-level memristor element 12 as discussed in any of the variants herein. In the example of FIG. 27 each of the input resistance 302 and the feedback resistance 303 are implemented as multi-level memristor elements 12. In this case the value of the input resistance 302 and the feedback resistance 303 may be selectively programmed to provide a desired gain. Once programmed the memristors elements will maintain the resistance values, and hence the selected gain level, until reprogrammed. This may conveniently allow the gain of the amplifier to be selectively varied between a plurality of different gain values, but maintaining a selected gain value may not require any power to be applied to control the input resistance 302 or feedback resistance 303. It will be understood that other arrangements are possible and there may be one or more fixed resistance in some combination. It will also be understood that FIG. 27 shows a single-ended configuration but the same principles could be applied to differential amplifiers.

FIG. 27 illustrates just one example of use of a multi-level memristor element. Other applications could include use in a trimming circuit, to trim some signal of interest, e.g. adjustment of a signal of interest so as to adjust operation of a circuit to provide standardised operation. A multi-level memristors may allow a selected value to be programmed to provide a certain degree of trimming, but the use of a multi-level memristor may allow subsequent re-programming to adjust the degree of trimming. A multi-level memristor may be used as part of a programmable filter circuit, or voltage controlled oscillator or any other circuit where a programmable resistance may be advantageous.

The discussion above has focused on the use of binary memristors. As used herein the term memristor may refer to an electronic element that has a variable resistance which can be controlled varied and which has some memory such that a particular resistance state persists in the absence of applied power. Binary memristors have been proposed, for instance based on MRAM (Magnetoresistive random-access memory) or ReRAM (Resistive random-access memory) memory, that can exhibit either a high resistance state or a low resistance state and can be selectively programmed to operate in the desired state, for instance by applying suitable programming voltages. An individual MRAM or ReRAM memory or memristor may thus be used as binary memristor and can be seen as a type of programmable memory.

However there may be other types of programmable-resistance memory component that may be programmable and can be selectively controlled to adopt one of two different states, where each state exhibits a different resistance or conductance, and the selected state persists once programmed. For instance programmable-resistance memory components could comprise or be based on flash-based memory, e.g. floating-gate technologies such as ESF3, charge-trap technologies such as Silicon-Oxide-Nitride-Oxide-Silicon technologies (SONOS), fuses (polysilicon or metal), carbon nanotubes or some non-memristive MRAM technologies such as spintronic technology, or phase-change memory such as chalcogenide glass. In general, any suitable programmable-resistance memory component could be used as a binary memory component in place of at least some of the binary memristors described in the various embodiments.

In general therefore some embodiments relate to a programmable resistance element, the programmable resistance element comprising a plurality of programmable-resistance memory components arranged in combination between first and second terminals of the multi-level memristor element to define a plurality of programmable portions, wherein each programmable portion comprises one or more of said programmable-resistance memory configured such that each programmable portion can be individually programmed to a selected one of two different resistance states, and wherein said plurality of programmable portions can be programmed in combination to provide a selected one of more than two values of overall resistance between the first and second terminals.

The invention is not limited to the embodiments described herein, and may be modified or adapted without departing from the scope of the present invention.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A two-terminal multi-level memristor comprising:
 a first set of resistance elements comprising a plurality of resistance elements connected in series between first and second terminals of the multi-level memristor; and
 a second set of resistance elements comprising a plurality of second resistance elements, wherein each of the resistance elements of the second set is connected in parallel with a different number of one or more of the series connected resistance elements of the first set,
 wherein one of the first set and second set of resistance elements comprises a plurality of binary memristors that can be selectively programmed to either a high or low resistance state and the other of the first and second set of resistance elements comprises a plurality of shunt resistors.

2. The multi-level memristor element of claim 1, wherein the first set of resistance elements comprises said plurality of binary memristors and second set of resistance elements comprises said plurality of shunt resistors.

3. The multi-level memristor element of claim 1, wherein the first set of resistance elements comprises said plurality of shunt resistors and second set of resistance elements comprises said plurality of binary memristors.

4. The multi-level memristor element of claim 3, wherein the first set of resistance elements further comprises a binary memristor.

5. The multi-level memristor element of claim 1, wherein the first set of resistance elements further comprises a resistance element which is not in parallel with any of the resistance elements of the second set of resistance elements.

6. The multi-level memristor element of claim 1, wherein the first set of resistance elements further comprises an offset resistor.

7. The multi-level memristor element of claim 1, wherein each of the resistance elements of the second set of resistance elements is connected, on one side, to a common node.

8. The multi-level memristor element of claim 7, wherein said common node is one of the two terminals of the two-terminal multi-level memristor.

9. The multi-level memristor element of claim 1, wherein the first and second sets of resistance elements are configured such that a resultant change in overall resistance of the two-terminal multi-level memristor as a result of varying the resistance state of one of the binary memristors between the high and low resistance states is different for each of the binary memristors.

10. The multi-level memristor element of claim 9, wherein the resultant changes in overall resistance of the two-terminal multi-level memristor as a result of varying the resistance state of the binary memristors is scaled to provide a binary coding.

11. The multi-level memristor element of claim 1, wherein each of the plurality of binary memristors has substantially the same resistance characteristics.

12. The multi-level memristor element of claim 1, further comprising switching circuitry, the switching circuitry configured to apply electrical control signal to selectively program said binary memristors to either of a high resistance or a low resistance state.

13. The multi-level memristor element of claim 11, further comprising a controller configured to receive an input data value to be applied using the two-terminal multi-level memristor element, wherein the controller is configured to control the switching circuitry to program the binary memristors based on the input data value.

14. The multi-level memristor element of claim 13, wherein the controller is configured to control the programming of the binary memristors based on the input data value such that a variation in the input data value leads to a variation in conductance of the two-terminal multi-level memristor which varies linearly with the input data value.

15. An analogue computing circuit comprising the two-terminal multi-level memristor of claim 1.

16. A synapse circuit for a neural network comprising at least one two-terminal multi-level memristor as claimed in claim 1.

17. The synapse circuit of claim 16, wherein the synapse circuit comprises:
an input to receive at least one data input signal indicative of a data input, the data input signal provided as a voltage or current;
an output to provide at least one data output current indicative of the data input times a defined weighting value; and
at least first and second data paths between the input and the output, each of said data paths comprising one of said at least one two-terminal multi-level memristor,
wherein the at least one data input signal is applied to at least one of the data paths,
wherein the resistance level of at least one multi-level memristor is adjusted based on the defined weighting value, and
wherein the data output current is based on the current through said at least first and second data paths.

18. A two-terminal multi-level memristor element comprising:
a plurality of first resistance elements connected in series between first and second terminals of the multi-level memristor element; and
a plurality of second resistance elements, wherein each of the second resistance elements is connected in parallel with a different number of one or more of the series connected first resistance elements,
wherein one of the first and second resistance elements comprise binary memristors that can be selectively programmed to either a high or low resistance state and the other of the first and second resistance elements comprise shunt resistors.

19. The two-terminal multi-level memristor element of claim 1, wherein the first resistance elements comprise said binary memristors and the second resistance elements comprise said shunt resistors.

20. A two-terminal memristor apparatus which is programmable to provide more than two different define resistance values between the two terminals, the apparatus comprising:
a first set of a plurality of resistance elements connected in series between the two terminals of the multi-level memristor apparatus; and
a second set of a plurality of resistance elements which are nested in parallel with different numbers of resistance elements of the first set,
wherein at least some of the resistance elements of the first and second sets comprise binary memristors that can be selectively programmed to either a high or low resistance state and at least some of the resistance elements of the first and second sets comprise non-programmable resistors.

* * * * *